(12) United States Patent
Tsukahara

(10) Patent No.: US 9,807,891 B2
(45) Date of Patent: Oct. 31, 2017

(54) ELECTRONIC APPARATUS

(71) Applicant: MITSUBISHI ELECTRIC CORPORATION, Tokyo (JP)

(72) Inventor: Rei Tsukahara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 4 days.

(21) Appl. No.: 14/905,751

(22) PCT Filed: Sep. 9, 2013

(86) PCT No.: PCT/JP2013/074261
§ 371 (c)(1),
(2) Date: Jan. 15, 2016

(87) PCT Pub. No.: WO2015/033472
PCT Pub. Date: Mar. 12, 2015

(65) Prior Publication Data
US 2016/0150658 A1    May 26, 2016

(51) Int. Cl.
*H05K 5/00* (2006.01)
*G09F 7/18* (2006.01)
(Continued)

(52) U.S. Cl.
CPC ..... *H05K 5/0017* (2013.01); *G02F 1/133308* (2013.01); *G09F 7/18* (2013.01);
(Continued)

(58) Field of Classification Search
CPC .. H05K 5/0004; H05K 5/0017; H05K 5/0204; H05K 5/0217; G09F 7/18
See application file for complete search history.

(56) References Cited

U.S. PATENT DOCUMENTS 8,284,343 B2 * 10/2012 Koike ............... G02F 1/133308
349/56
8,736,783 B2 * 5/2014 Lo ........................ G06F 1/1637
349/58
(Continued)

FOREIGN PATENT DOCUMENTS

JP     5-27722 U    4/1993
JP     7-14431 U    3/1995
(Continued)

OTHER PUBLICATIONS

U.S. Appl. No. 14/412,711, filed Jan. 5, 2015.

*Primary Examiner* — Hoa C Nguyen
*Assistant Examiner* — Christopher L Augustin
(74) *Attorney, Agent, or Firm* — Birch, Stewart, Kolasch & Birch, LLP

(57) ABSTRACT

An electronic apparatus includes a display module 3, a frame-like housing member 2, a temporary holding member 6, and a fixing member 4. The frame-like housing member 2 has side wall sections 2*a*-1 and 2*a*-2 opposing each other. The temporary holding member 6 is assembled to the frame-like housing member 2 by being engaged and aligned with the side wall section 2*a*-2 and by being engaged with and fixed to the side wall section 2*a*-1. The fixing member 4 is assembled to the frame-like housing member 2 by being engaged and aligned with the side wall section 2*a*-1 and by being engaged with and fixed to the side wall section 2*a*-2.

5 Claims, 28 Drawing Sheets

(51) Int. Cl.
  *G02F 1/1333*    (2006.01)
  *H05K 5/02*     (2006.01)
  *G09F 9/30*     (2006.01)

(52) U.S. Cl.
  CPC ......... *H05K 5/0004* (2013.01); *H05K 5/0204* (2013.01); *H05K 5/0217* (2013.01); *G09F 9/30* (2013.01); *G09F 2007/1843* (2013.01); *G09F 2007/1865* (2013.01)

(56) References Cited

U.S. PATENT DOCUMENTS

| | | | | |
|---|---|---|---|---|
| 2003/0030765 | A1* | 2/2003 | Hayashi | G02F 1/133308 349/65 |
| 2003/0103173 | A1 | 6/2003 | Satonaka | |
| 2004/0196413 | A1 | 10/2004 | Satonaka | |
| 2005/0213924 | A1 | 9/2005 | Sakurai et al. | |
| 2006/0139889 | A1* | 6/2006 | Lin | G02F 1/133308 361/715 |
| 2006/0274493 | A1* | 12/2006 | Richardson | G06F 1/1626 361/679.4 |
| 2007/0132908 | A1* | 6/2007 | Kim | G02F 1/133308 349/58 |
| 2010/0116387 | A1* | 5/2010 | Channey | A45C 11/00 150/165 |
| 2011/0228458 | A1* | 9/2011 | Richardson | H04M 1/0252 361/679.01 |
| 2013/0015081 | A1* | 1/2013 | Wu | A45C 11/00 206/216 |
| 2013/0127309 | A1* | 5/2013 | Wyner | H05K 5/0217 312/223.1 |
| 2013/0293072 | A1* | 11/2013 | Sturniolo | H05K 5/0004 312/138.1 |
| 2015/0146350 | A1* | 5/2015 | Tsukahara | B60R 11/0235 361/679.01 |

FOREIGN PATENT DOCUMENTS

| | | |
|---|---|---|
| JP | 2000-31661 A | 1/2000 |
| JP | 2001-83900 A | 3/2001 |
| JP | 2003-167235 A | 6/2001 |
| JP | 2001-318365 A | 11/2001 |
| JP | 2005-275076 A | 10/2005 |
| JP | 2006-39361 A | 2/2006 |
| JP | 2008-76918 A | 4/2008 |
| JP | 4841124 B2 | 12/2011 |
| JP | 2012-189953 A | 10/2012 |
| JP | 2012-199102 A | 10/2012 |
| WO | WO 2014/049680 A1 | 4/2014 |

* cited by examiner

FIG.1
(a)
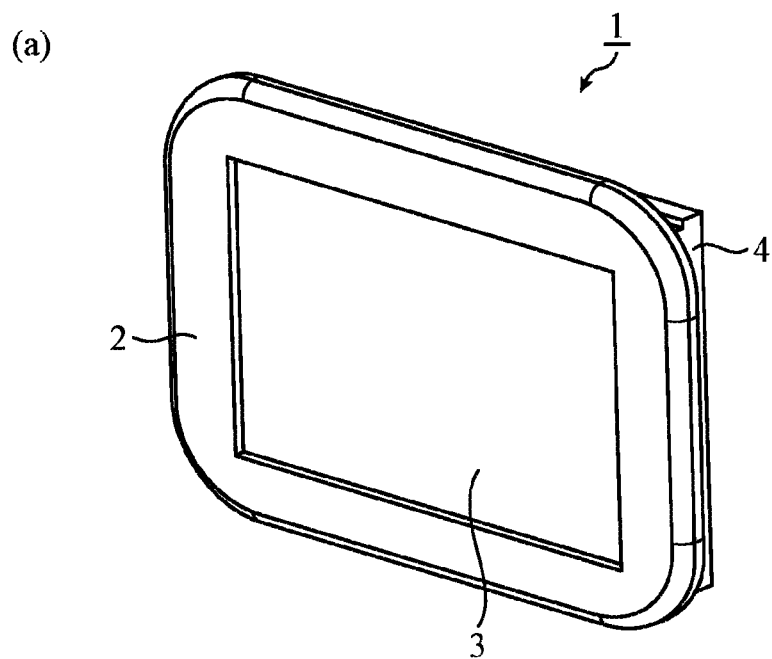
(b)
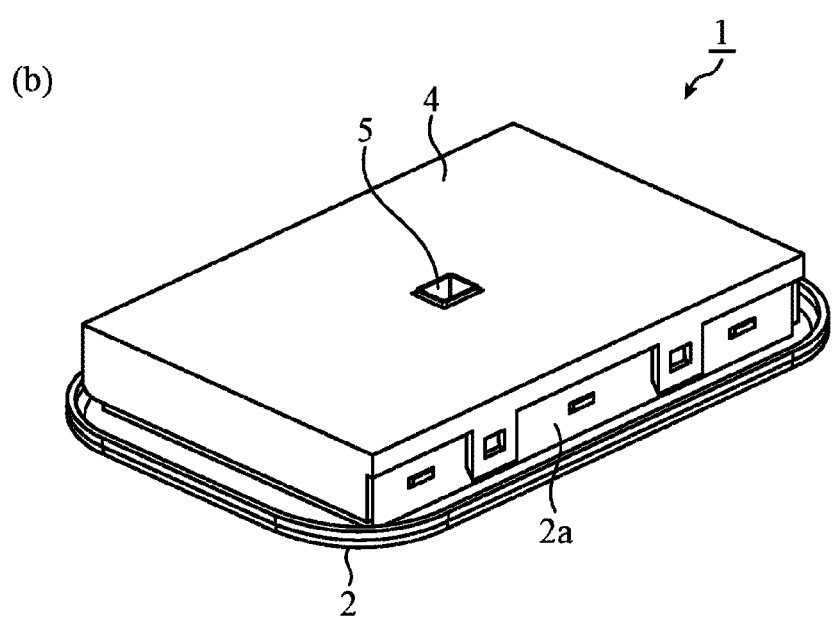

FIG.5
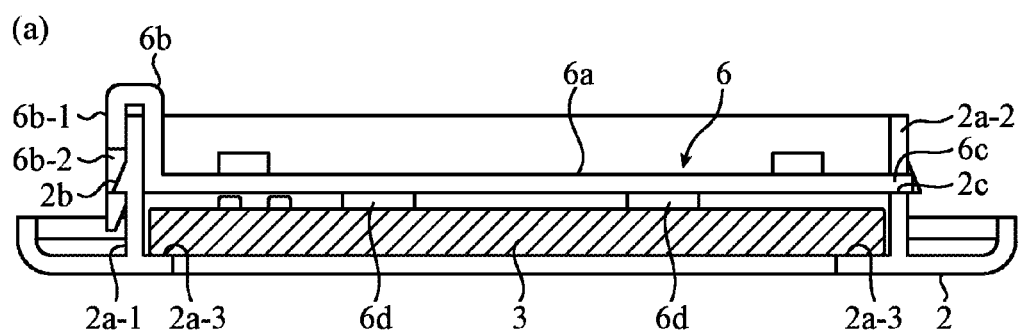
(a)
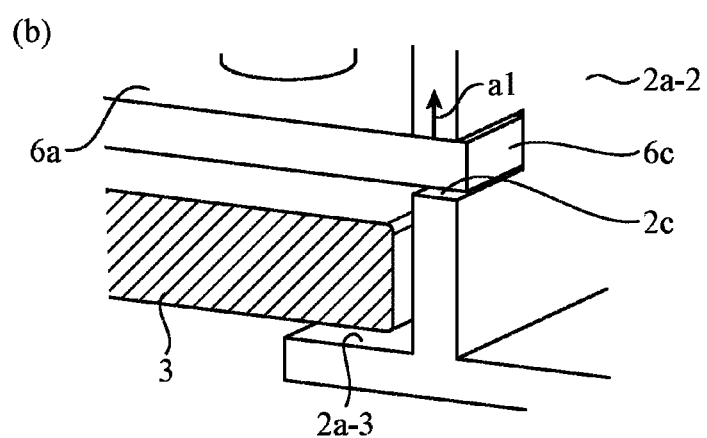
(b)
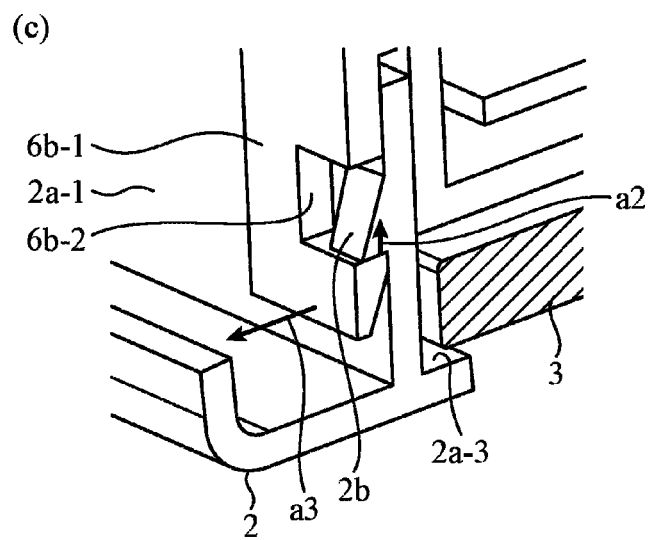
(c)

FIG.8
(a)
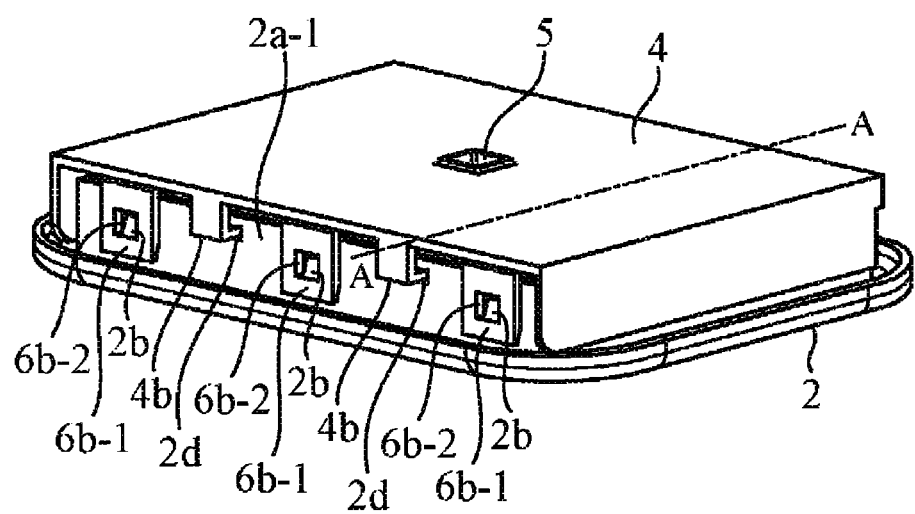
(b)
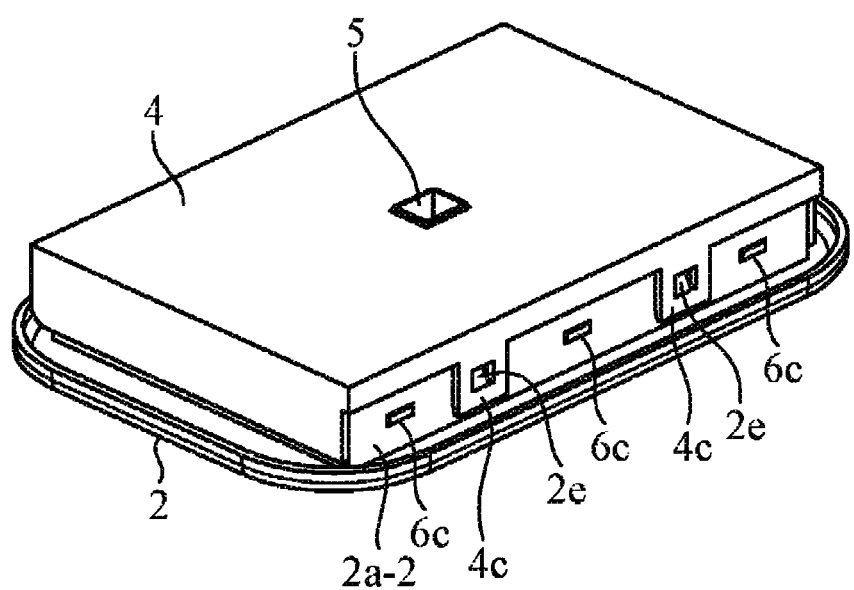

FIG.10
(a)
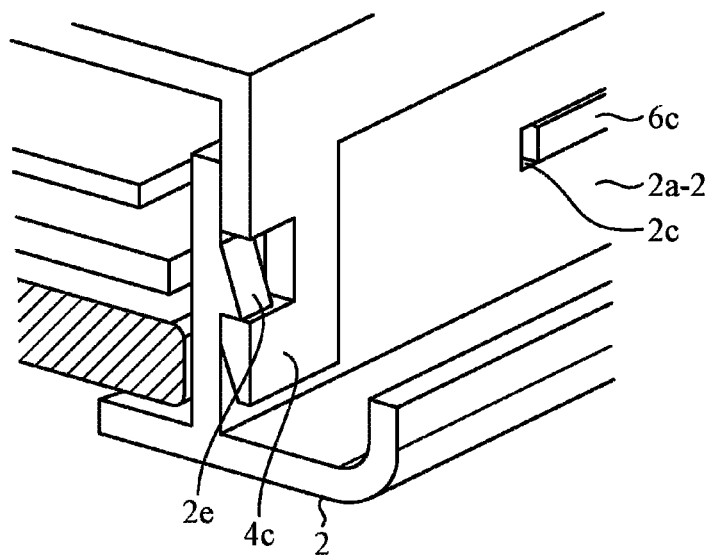
(b)
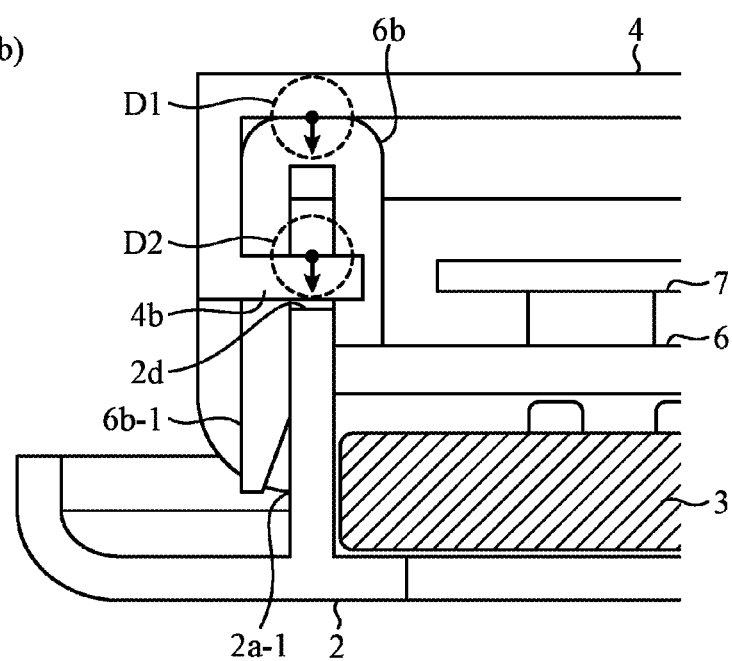

FIG.12
(a)
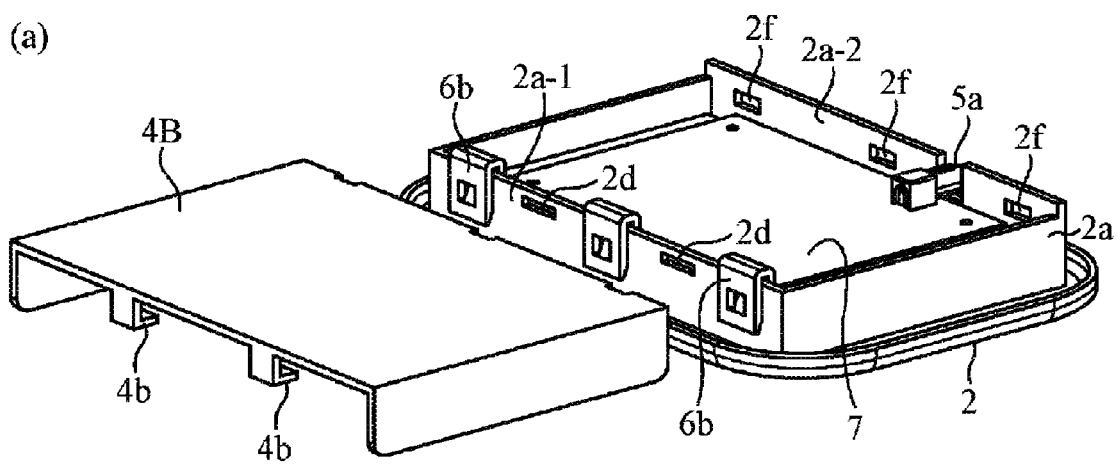
(b)
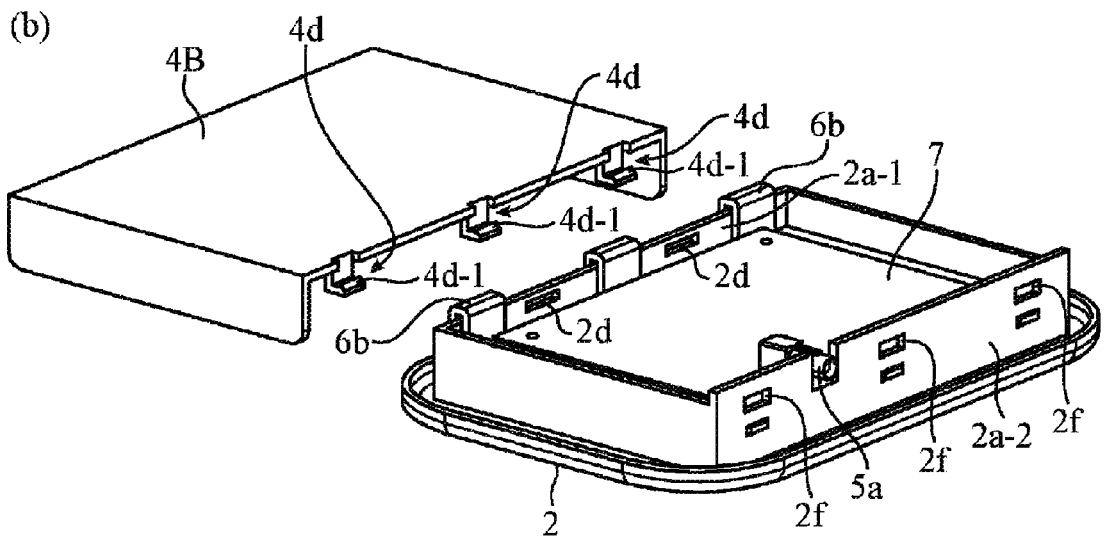

FIG.14
(a)
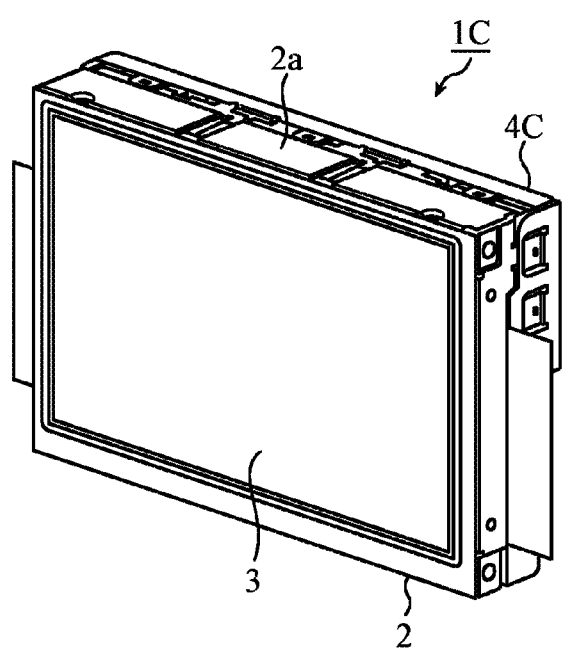
(b)
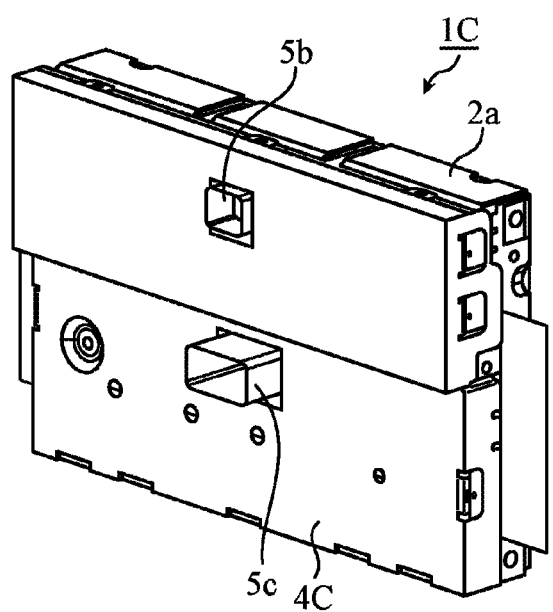

FIG.17
(a)
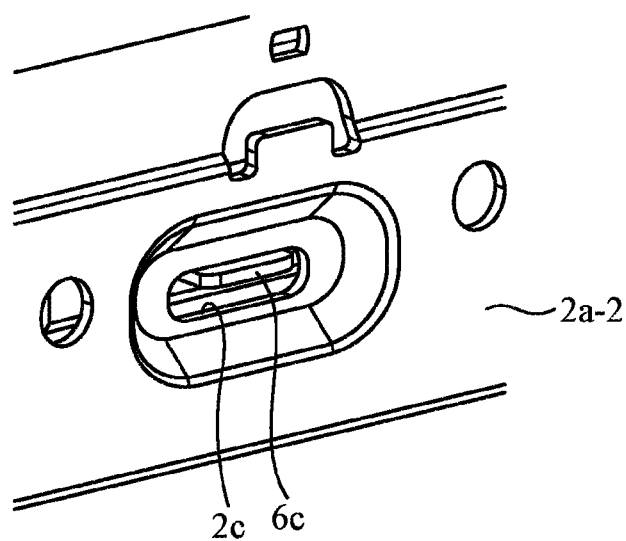
(b)
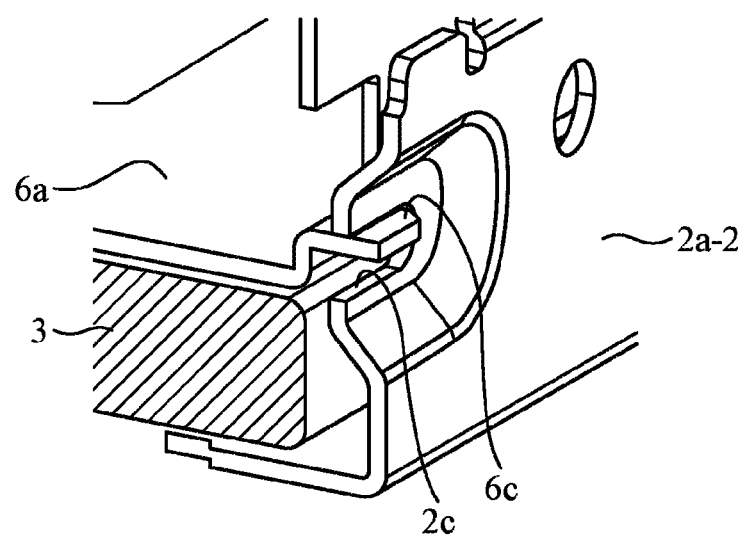

FIG.18
(a)
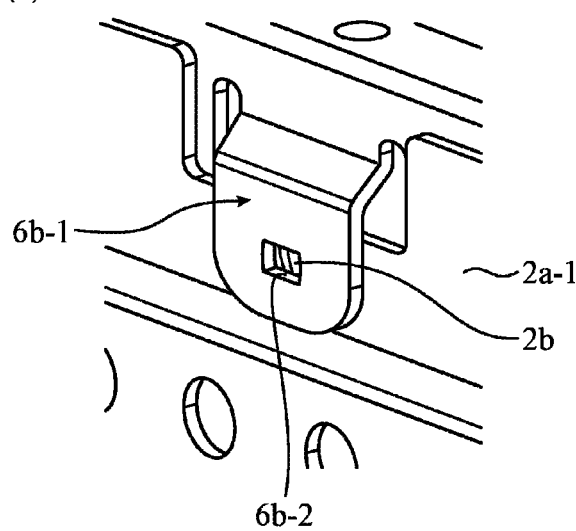
(c)
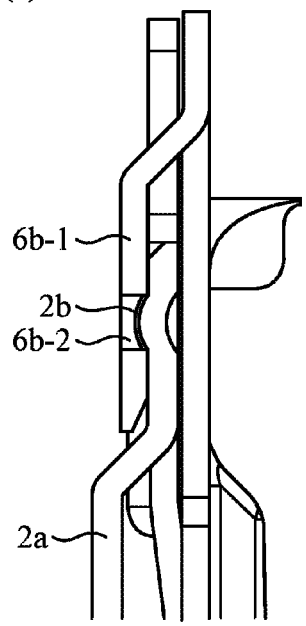
(b)
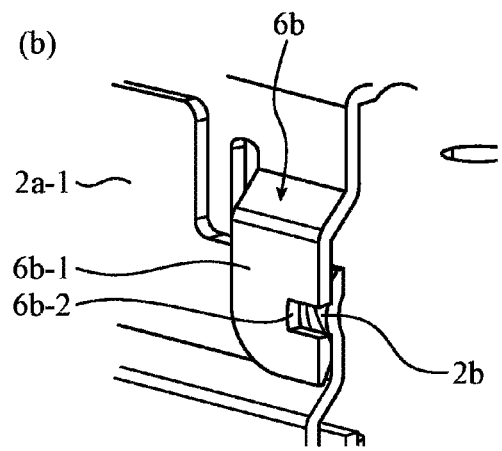
(d)
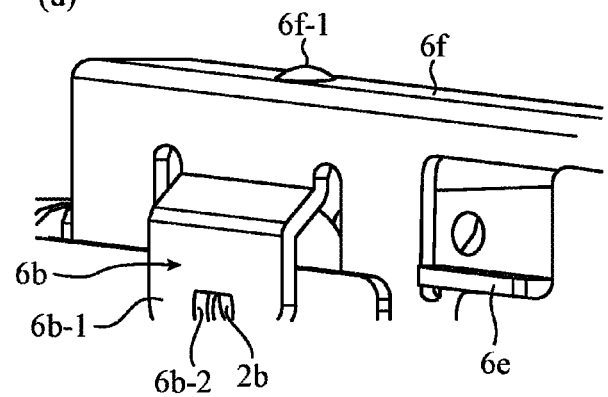

FIG.19
(a)
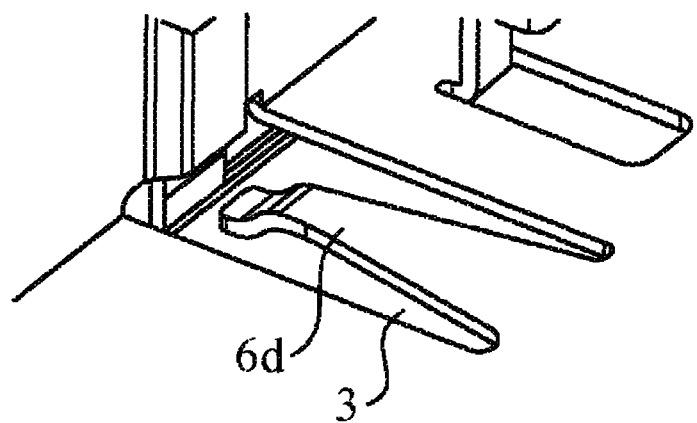
(b)
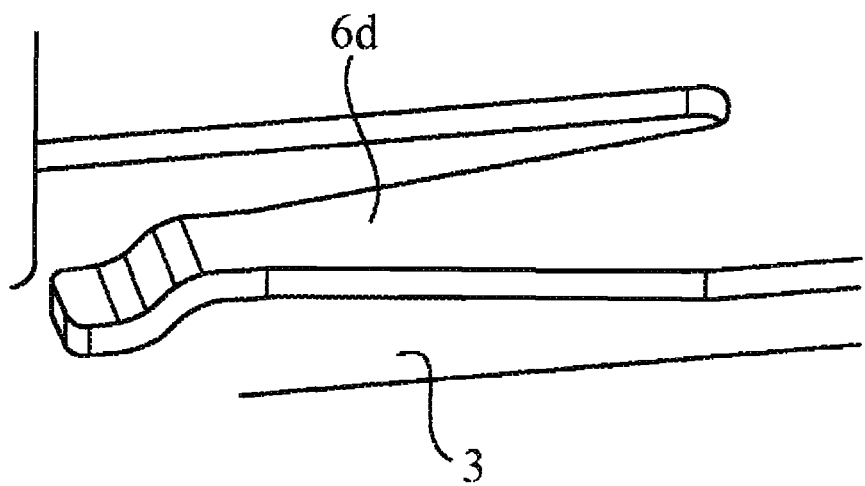

FIG.25
(a)
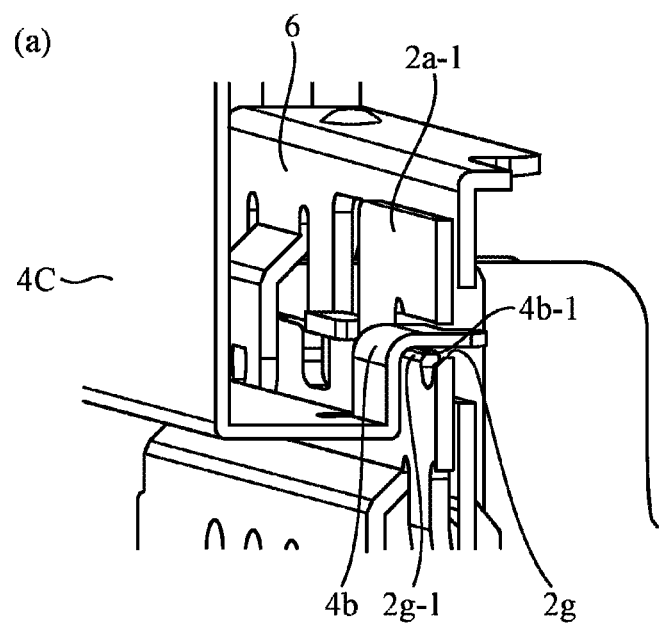
(b)
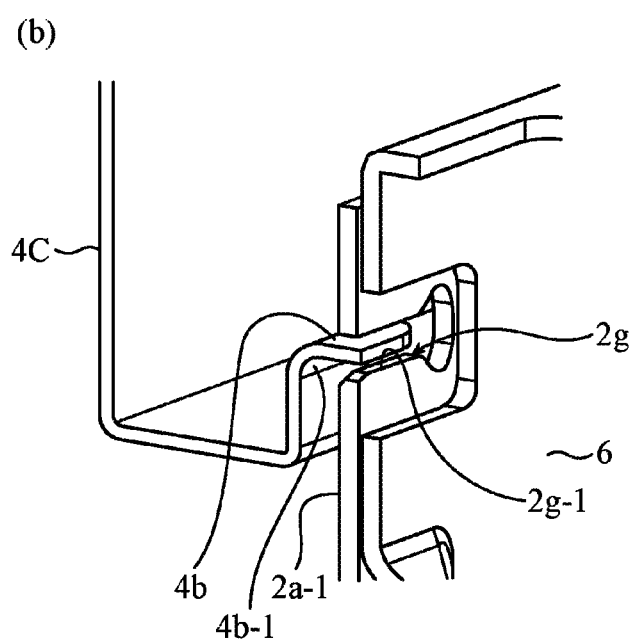

FIG.30
(a)
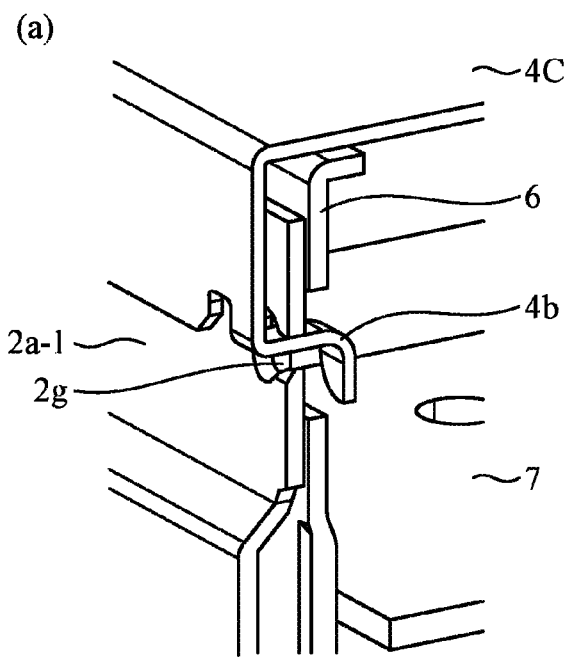
(b)
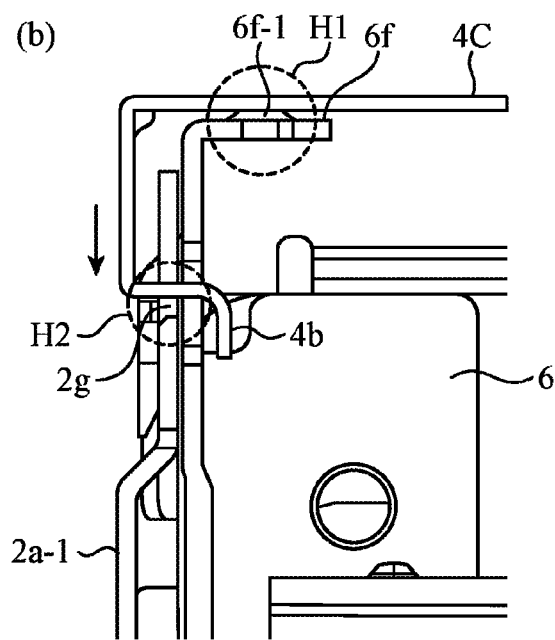

ELECTRONIC APPARATUS

TECHNICAL FIELD

The present invention relates to an electronic apparatus with a structure for holding a housing object such as a display module inside a case.

BACKGROUND ART

For example, Patent Document 1 discloses a structure for housing and fixing a backlight unit in a box-like base having one open surface. In this structure, an engaging hole formed on the base and an engaging protrusion formed on the backlight unit are engaged with and fixed to each other.

In an electronic apparatus disclosed in Patent Document a liquid crystal display unit is mounted in a mounting depression provided on a rear surface of a front cover and, in this state, a liquid crystal fixing plate is abutted against a rear surface of the liquid crystal display unit to fix the liquid crystal display unit. Also in this electronic apparatus, an engaging protrusion and an engaging hole provided on the liquid crystal fixing plate are engaged with and fixed to an engaging hole and an engaging protrusion provided on a peripheral wall section, of the mounting depression, that encloses the liquid crystal display unit.

In addition, Patent Document 3 discloses a display panel attaching structure in which a display panel is housed in a display panel supporting frame and the display panel is fixed within the display panel supporting frame by a display panel pressing plate from a front surface side of the display panel. In this structure, engaging protrusions (engaging protrusions) are formed on the display panel supporting frame, engaging holes are opened on the display panel pressing plate, and a pressing piece is formed in the engaging hole on one side surface. When the display panel is mounted to the display panel supporting frame and covered by the display panel pressing plate, the engaging protrusion of the display panel supporting frame engages the engaging hole. At this point, since the display panel pressing plate is pulled toward one side due to an elastic force of the pressing piece, play is eliminated and detachment of the engaging protrusion from the engaging hole is prevented.

PRIOR ART DOCUMENTS

Patent Documents

Patent Document 1: Japanese Utility Model Application Laid-open No. H7-14431
Patent Document 2: Japanese Patent Application Laid-open No. 2006-39361
Patent Document 3: Japanese Utility Model Application Laid-open No. H5-27722

SUMMARY OF THE INVENTION

Problems to be Solved by the Invention in conventional techniques as represented by Patent Documents 1 and 2, engaging protrusions and engaging holes are provided on both a case member that houses a housing object such as a display panel unit and a fixing member that fixes the housing object in a state where the housing object is housed in the case member, and the engaging protrusions and the engaging holes are engaged with each other to fix the case member and the fixing member to each other. With this structure, while fixing can be achieved by a simple operation such as hooking an engaging protrusion on an opening edge section of an engaging hole, there is a disadvantage that the engagement of the engaging protrusion and the engaging hole can easily become disengaged when subjected to an external force such as vibration. In particular, since the ease of disengagement increases significantly as the mass of the housing object increases, reliability of engagement and fixing by engaging protrusions and engaging holes alone is low.

In addition, although engagement and fixing by engaging protrusions and engaging holes can conceivably be assisted with a pressing piece as described in Patent Document 3, since firm fixing is realized, once assembled, subsequent disassembly becomes difficult.

In a production line of an electronic apparatus, internal inspections and various corrections of an assembled product are essential. Such internal inspections and corrections require the assembled product to be disassembled. In this case, if firm fixing is realized by a pressing piece, disassembly work becomes either impossible or may require a long time.

The present invention has been made in order to solve the problems described above and an object thereof is to obtain an electronic apparatus which can be readily assembled and disassembled and which is capable of firmly holding a housing object.

Means for Solving the Problems

An electronic apparatus according to the present invention includes: a housing object; a housing section which has at least one surface being opening and which houses the housing object in a space enclosed by side walls of the opening; a first member which is assembled to the housing section so as to cover the housing object; and a second member which is assembled to the housing section so as to cover the first member, wherein the housing section has first and second side wall sections opposing each other, the first member is assembled to the housing section by being engaged and aligned with the second side wall section and by being engaged with and fixed to the first side wall section, and the second member is assembled to the housing section by being engaged and aligned with the first side wall section, and by being engaged with and fixed to the second side wall section so as to prevent disengagement of the engagement and fixing of the first member.

Effect of the Invention

According to the present invention, an advantageous effect is obtained in that assembly and disassembly can be readily performed and a housing object can be firmly held.

BRIEF DESCRIPTION OF THE DRAWINGS

FIGS. 1(a) and 1(b) are diagrams showing an electronic apparatus according to Embodiment 1 of the present invention.

FIGS. 5(a) to 5(c) are diagrams showing a structure in which a temporary holding member is engaged with and fixed to a frame-like housing member housing a display module.

FIGS. 8(a) and 8(b) are perspective views showing an electronic apparatus to which a fixing member is assembled.

FIGS. 10(a) and 10(b) are diagrams showing a structure of an engaging and aligning section and an engaging and fixing section of the fixing member according to Embodiment 1.

FIGS. 12(a) and 12(b) are diagrams showing an assembling mode of a fixing member according to Embodiment 2.

FIGS. 14(a) and 14(b) are diagrams showing an electronic apparatus according to Embodiment 3 of the present invention.

FIGS. 17(a) and 17(b) are diagrams showing an engaging structure of the temporary holding member and a frame-like housing member according to Embodiment 3.

FIGS. 18(a) to 18(d) are diagrams showing an engaging structure of the temporary holding member and the frame-like housing member according to Embodiment 3.

FIGS. 19(a) and 19(b) are perspective views showing an urging member formed on the temporary holding member according to Embodiment 3.

FIGS. 25(a) and 25(b) are enlarged sectional views of a region F shown in FIG. 24.

FIGS. 30(a) and 30(b) are enlarged sectional views of a region G shown in FIG. 29.

BEST MODE FOR CARRYING OUT THE INVENTION

Figure 2:
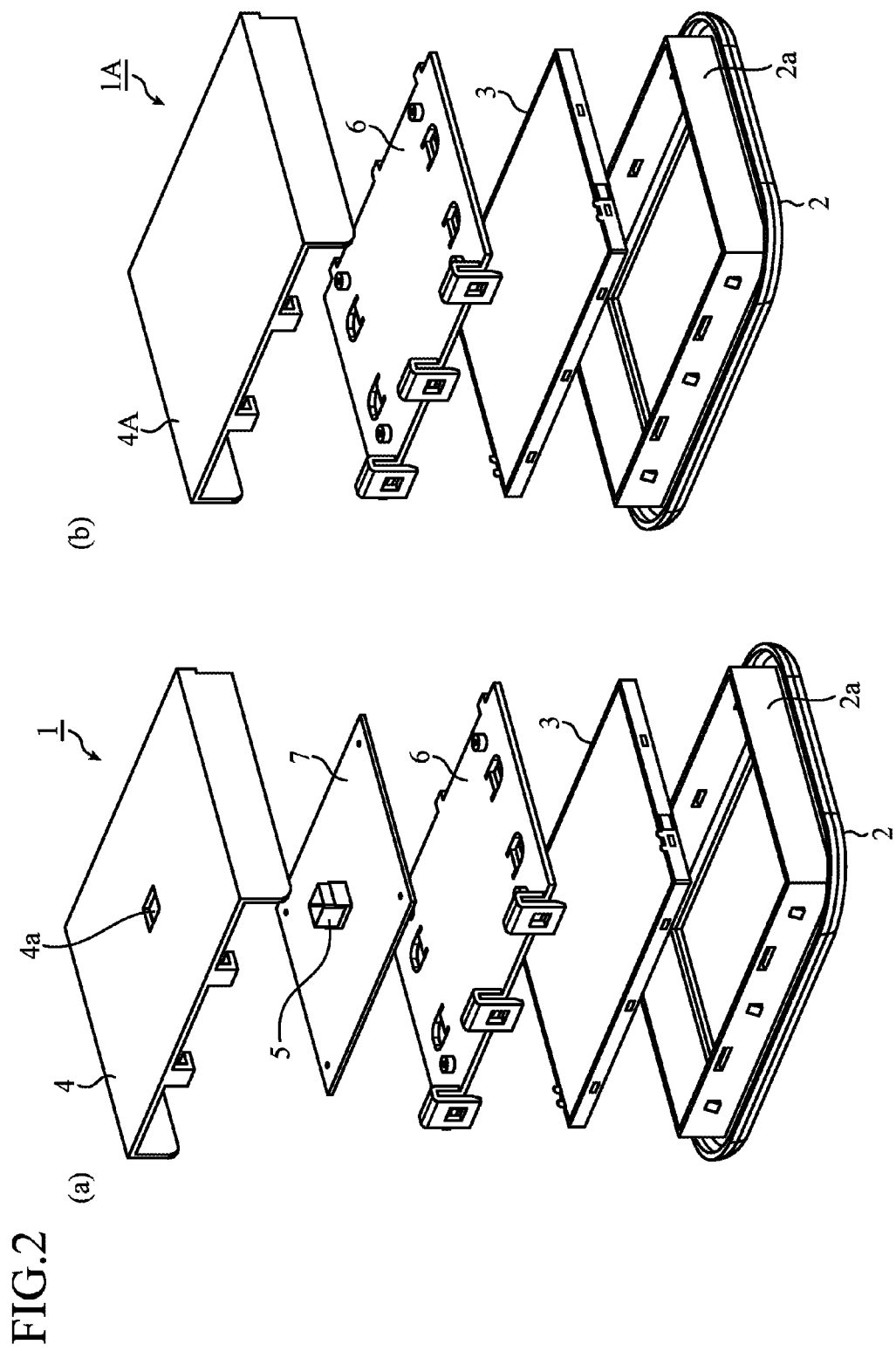
FIGS. 2(a) and 2(b) are exploded perspective views of the electronic apparatus according to Embodiment 1.

Hereinafter, in order to describe the present invention in greater detail, modes for carrying out the present invention will be described with reference to the accompanying drawings.

Embodiment 1

FIG. 1 is a diagram showing an electronic apparatus according to Embodiment 1 of the present invention, in which FIG. 1(a) is a front-side perspective view and FIG. 1(b) is a rear-side perspective view. An electronic apparatus 1 according to the present invention is, for example, a vehicle-mounted apparatus such as a navigation device or an audio apparatus having a display. The electronic apparatus 1 shown in FIG. 1(a) includes a frame-like housing member 2, a display module 3, and a fixing member 4. A display surface of the display module 3 is exposed to the outside through a front-side opening of the frame-like housing member 2. As shown in FIG. 1(b), the fixing member 4 is a member that covers a rear surface and a part of a side wall 2a of the frame-like housing member 2. In addition, an internal circuit of the electronic apparatus 1 is connected to an external circuit via a connector 5 that is exposed from the rear surface of the fixing member 4.

FIG. 2 shows exploded perspective views of the electronic apparatus according to Embodiment 1, in which FIG. 2(a) shows the electronic apparatus 1 having a built-in electronic substrate 7 and FIG. 2(b) shows an electronic apparatus 1A without the built-in electronic substrate 7. As shown in FIG. 2(a), the electronic apparatus 1 is assembled in the order of the frame-like housing member 2, the display module 3, a temporary holding member 6, the electronic substrate 7, and the fixing member 4.

In the electronic apparatus 1, the connector 5 mounted on the electronic substrate 7 is exposed to the outside through an opening 4a of the fixing member 4. Meanwhile, as shown in FIG. 2(b), the electronic apparatus 1A is assembled in the order of the frame-like housing member 2, the display module 3, the temporary holding member 6, and a fixing member 4A. While the electronic apparatuses 1 and 1A differ from one another regarding whether or not the electronic substrate 7 is included, the electronic apparatuses 1 and 1A share a characteristic configuration of the present invention. Therefore, hereinafter, the electronic apparatus 1 will be mainly described.

The frame-like housing member 2 is a housing section which has openings on a front surface and a rear surface thereof and into which the display module 3 is housed through the opening on the rear surface. In addition, an installation margin that projects toward the inside of the opening is formed at a peripheral edge of the opening on the front surface of the frame-like housing member 2 in order to enable a peripheral edge section of the display module 3 to be mounted on the installation margin. A side wall 2a of the rear surface opening is erected from the rear surface of the frame-like housing member 2, and the display module 3 is housed in a space formed by the side wall 2a.

Moreover, while a case has been shown where the frame-like housing member 2 has an opening for exposing the display surface of the display module 3 to the outside on the front surface and has an opening for housing the display module 3 on the rear surface, the present invention is not limited thereto. For example, any member structured such that at least one surface is opened in order to house a housing object and the housing object can be housed inside a space enclosed by a side wall of the opening may be used.

As shown in FIG. 2(a), the display module 3 is a housing object to be housed in the frame-like housing member 2. In addition, the display module 3 is constituted by, for example, a liquid crystal panel, a plasma panel, organic EL (electroluminescence), or the like. When the electronic apparatus 1 is a liquid crystal display apparatus, the display module 3 is constituted by modularized components such as a liquid crystal display panel, a liquid crystal display driver circuit and a backlight, which are necessary for liquid crystal display.

As shown in FIG. 2(a), the temporary holding member 6 is a first member which is assembled to the frame-like housing member 2 so as to cover the display module 3. The electronic substrate 7 is a printed board on which the connector 5 is mounted. In addition, the fixing member 4 is a second member which is assembled to the frame-like housing member 2 so as to cover the temporary holding member 6.

Figure 3:
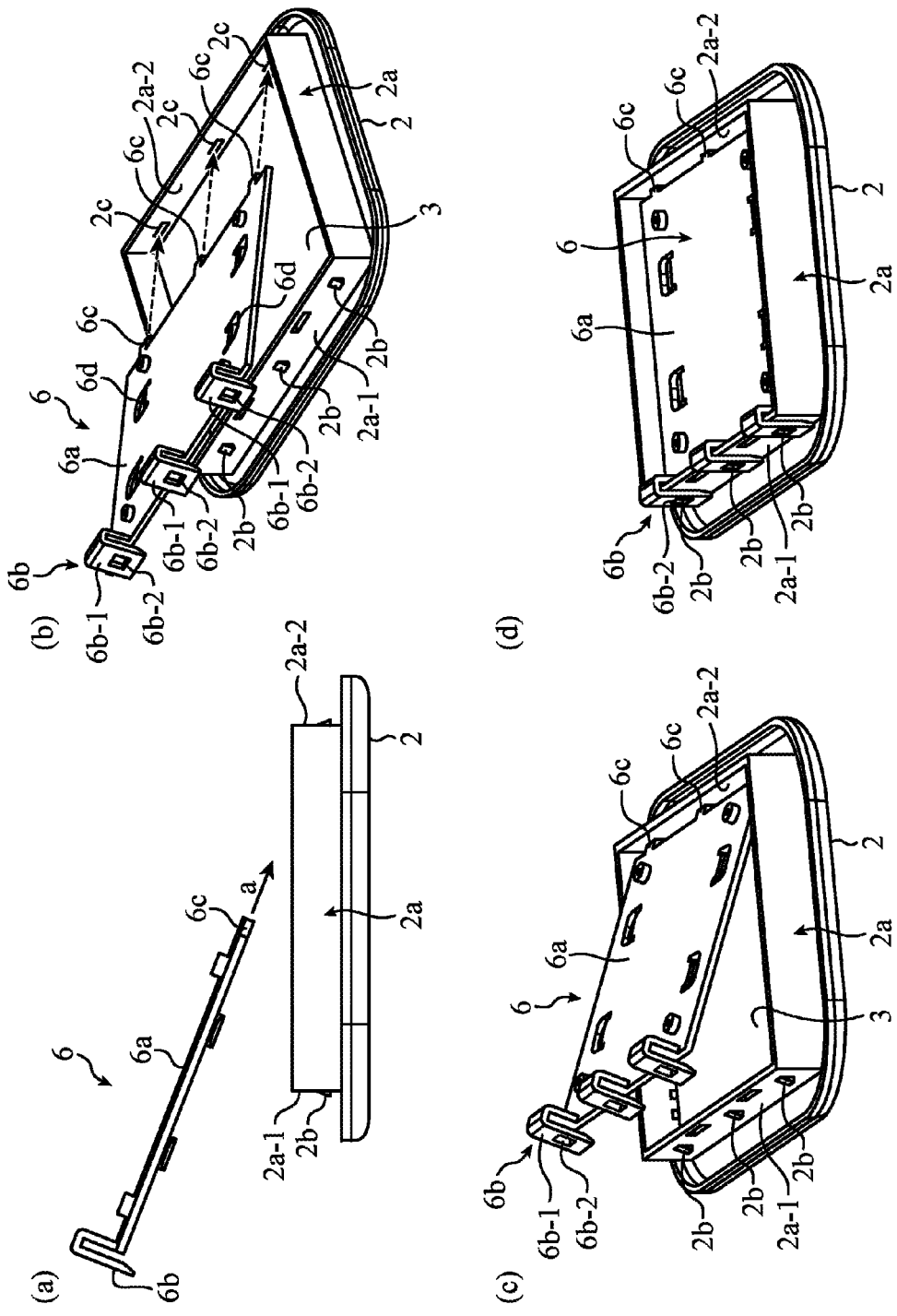
FIG. 3(a) to FIG. 3(d) are diagrams showing an assembling procedure of a temporary holding member according to Embodiment 1.

FIG. 3 is a diagram showing an assembling procedure of the temporary holding member according to Embodiment 1, in which assembly is performed in the order from FIG. 3(a) to FIG. 3(d). In FIG. 3, it is assumed that the display module 3 is housed in the frame-like housing member 2. In this case, as shown in FIG. 3(a), in the temporary holding member 6, an engaging and fixing section 6b is formed on one end side of a plate-like section 6a that constitutes a main body section, and an aligning protrusion 6c is formed on an end side that opposes the one end side. In addition, as shown in FIG. 3(b), an engaging hole 2c for alignment is formed on a side wall section 2a-2 of the frame-like housing member 2.

When assembling the temporary holding member 6 to the frame-like housing member 2, the temporary holding member 6 is inserted (in the direction a) with orienting the aligning protrusion 6c toward the side wall section 2a-2 of the frame-like housing member 2.

Next, as shown in FIG. 3(c), in a state where the temporary holding member 6 is inclined with respect to the frame-like housing member 2, the aligning protrusion 6c is engaged with the engaging hole 2c from the inside of the frame-like housing member 2.

In other words, a tip of the aligning protrusion 6c is inserted from the inside of the frame-like housing member 2 and abutted against an inner wall of the engaging hole 2c. Accordingly, the temporary holding member 6 is engaged and aligned with the side wall section 2a-2.

In addition, as shown in FIG. 3(b), the engaging and fixing section 6b of the temporary holding member 6 is constituted by a piece 6b-1 and an engaging hole 6b-2 formed at an end of the piece 6b-1.

Moreover, the piece 6b-1 is a piece that is curved in a U-shape so that spacing between a base and a tip thereof is approximately same to the thickness of the side wall section 2a-1.

Furthermore, an urging member 6d is formed on the plate-like section 6a of the temporary holding member 6 by folding a part of the plate-like section 6a downward.

Engaging protrusions 2b for engaging and fixing the temporary holding member 6 are formed on an outer peripheral section of the side wall section 2a-1 of the frame-like housing member 2.

From the state shown in FIG. 3(c), as the engaging and fixing section 6b side of the temporary holding member 6 is inclined toward the side wall section 2a-1 of the frame-like housing member 2 by using an engaging section of the aligning protrusion 6c and the engaging hole 2c as a fulcrum, the aligning protrusion 6c is gradually inserted into the engaging hole 2c. At this point, the side wall section 2a-1 is gradually inserted into a curved section of the piece 6b-1 and, eventually, the engaging protrusion 2b fits into and engages with the engaging hole 6b-2. Accordingly, as shown in FIG. 3(d), the temporary holding member 6 is engaged with and fixed to the side wall section 2a-1.

Figure 4:
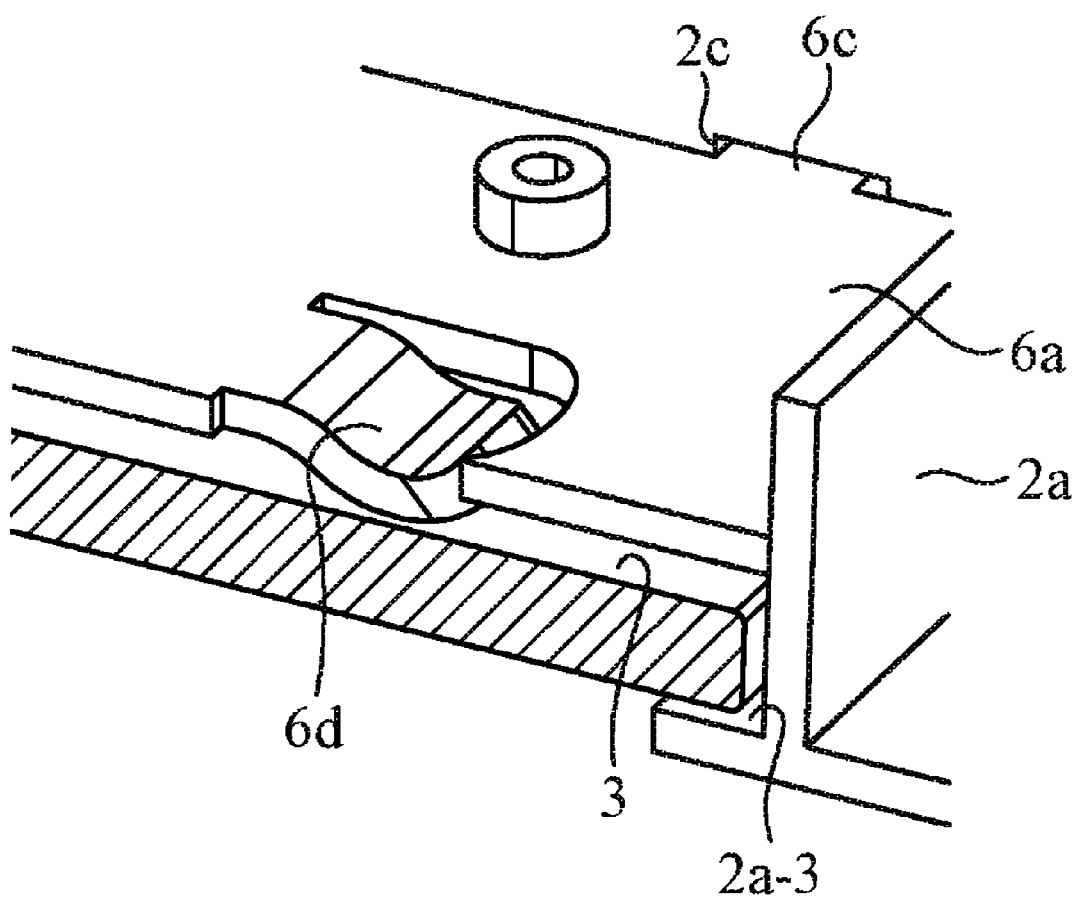
FIG. 4 is a sectional perspective view showing an urging member formed on the temporary holding member according to Embodiment 1.

In addition, the urging member 6d of the temporary holding member 6 is a claw-like member formed by folding a part of the plate-like section 6a downward, and a tip of the urging member 6d is curved as shown in FIG. 4. In a state where the temporary holding member 6 is assembled to the frame-like housing member 2, the urging member 6d abuts against the rear surface of the display module 3 with a portion corresponding to a turning point of the curve and urges the display module 3 toward the front surface thereof. Accordingly, a peripheral edge section of the display module 3 is pressed against the installation margin 2a-3 and the display module 3 can be housed inside the frame-like housing member 2 without play.

FIG. 5 is a diagram showing a structure in which a temporary holding member is engaged with and fixed to a frame-like housing member housing a display module, in which FIG. 5(a) is a sectional view including an engaging and fixing section and an engaging and aligning section, FIG. 5(b) is a sectional perspective view of the engaging and aligning section, and FIG. 5(c) is a sectional perspective view of the engaging and fixing section.

As shown in FIG. 5(a), in a structure in which the temporary holding member 6 is engaged with and fixed to the frame-like housing member 2 that houses the display module 3, the display module 3 is urged against the installation margin 2a-3 of the frame-like housing member 2 by the urging member 6d of the temporary holding member 6. At this point, upon receiving a reaction force from the display module 3 of the urging by the urging member 6d, the aligning protrusion 6c enters a state where the aligning protrusion 6c pushes an upper surface of the engaging hole 2c in the direction a1 as shown in FIG. 5(b).

Since the aligning protrusion 6c urges the upper surface of the engaging hole 2c in this manner, an engaging section can be realized in which the aligning protrusion 6c is less likely to disengage from the engaging hole 2c even if the plate-like section 6a of the temporary holding member 6 slides in the surface direction thereof.

Since the aligning protrusion 6c pushes the engaging hole 2c in the direction a1, even if a gap is formed on the opposite side to the direction a1 as shown in FIG. 5(b), the gap does not pose a problem.

Moreover, engagement and alignment by the aligning protrusion 6c and the engaging hole 2c merely represent an example and other configurations may be adopted as long as a structure enabling the temporary holding member 6 to be engaged and aligned with the side wall section 2a-2 of the frame-like housing member 2 is provided.

In addition, engagement and fixing by the engaging and fixing section 6b and the engaging protrusion 2b merely represent an example and other configurations may be adopted as long as a structure enabling the temporary holding member 6 to be engaged with and fixed to the side wall section 2a-1 of the frame-like housing member 2 is provided. For example, a structure may be adopted in which the side wall section 2a-1 has an engaging hole and the piece 6b-1 has an engaging protrusion.

In a similar manner, upon receiving a reaction force from the display module 3 of the urging by the urging member 6d, an inner wall surface section of the engaging hole 6b-2 of the engaging and fixing section 6b enters a state where the lower surface of the engaging protrusion 2b is pushed in the direction a2 as shown in FIG. 5(c). However, since the inner wall surface section of the engaging hole 6b-2 is only in contact with the lower surface of the engaging protrusion 2b, the engaging and fixing section 6b can be easily disengaged from the engaging protrusion 2b by simply bending the tip of the piece 6b-1 in a direction a3. Moreover, since the width of the engaging protrusion 2b is approximately the same as the opening width of the engaging hole 6b-2, the engaging and fixing section 6b is unlikely to disengage from the engaging protrusion 2b even when a force in the width direction is applied to the piece 6b-1.

Figure 6:
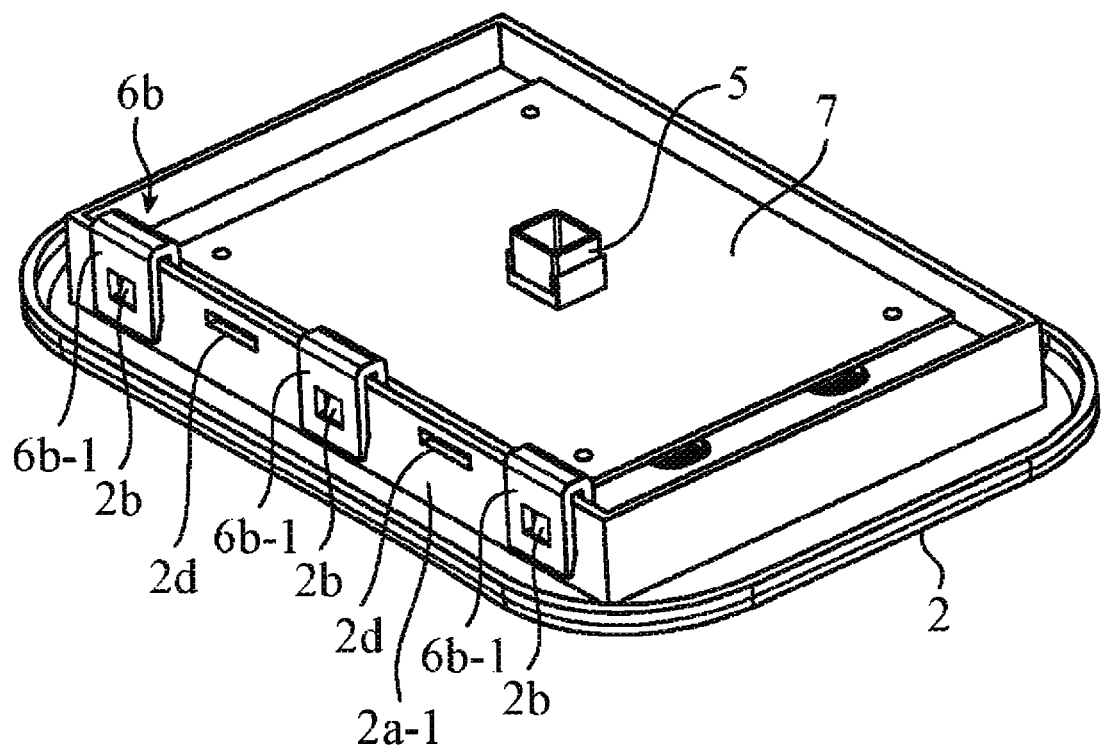
FIG. 6 is a perspective view showing a structure in which a substrate is mounted to the temporary holding member shown in FIG. 5.

As shown in FIG. 6, the electronic substrate 7 is mounted on an upper surface of the temporary holding member 6 assembled to the frame-like housing member 2. For example, the electronic substrate 7 is screwed to the plate-like section 6a of the frame-like housing member 2.

Moreover, fixing of the electronic substrate 7 is not limited to screwing and various other fastening methods may be applied.

Figure 7:
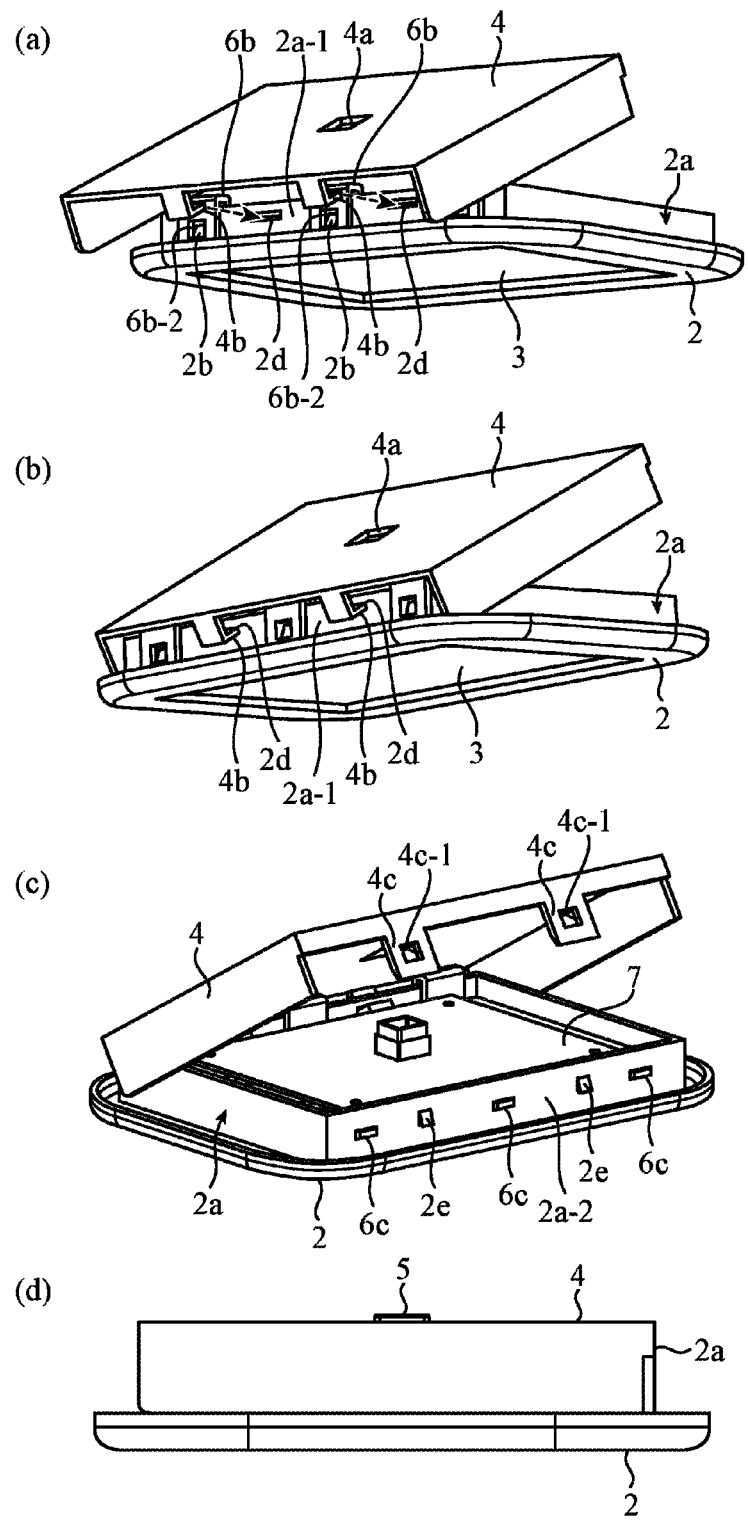
FIGS. 7(a) to 7(d) are diagrams showing an assembling procedure of a fixing member according to Embodiment 1.

FIG. 7 is a diagram showing an assembling procedure of the fixing member according to Embodiment 1, in which assembly is performed in the order from FIG. 7(a) to FIG. 7(d). In FIG. 7, it is assumed that the temporary holding member 6 is assembled to the frame-like housing member 2 (the structure shown in FIG. 6). In this case, in the fixing member 4, an aligning piece 4b is formed on one end side of a ceiling section as shown in FIG. 7(a). The aligning piece 4b is structured such that a tip of the piece extending downward from the end side of the ceiling section described above is folded inward in a hook shape. In addition, an engaging hole 2d for alignment is formed on the side wall section 2a-1 of the frame-like housing member 2.

When assembling the fixing member 4 to the frame-like housing member 2, as shown in FIG. 7(a), the aligning piece 4b is aligned with the engaging hole 2d (the direction indicated by an arrow).

Next, as shown in FIG. 7(b), in a state where the fixing member 4 is inclined with respect to the frame-like housing member 2, the aligning piece 4b is engaged with the engaging hole 2d from the outside of the frame-like housing member 2.

In other words, a tip of the aligning piece 4b is inserted from the outside of the frame-like housing member 2 and abutted against an inner wall of the engaging hole 2d. Accordingly, the fixing member 4 is engaged and aligned with the side wall section 2a-1.

Moreover, engagement and alignment by the aligning piece 4b and the engaging hole 2d merely represent an example and other configurations may be adopted as long as a structure enabling the fixing member 4 to be engaged and aligned with the side wall section 2a-1 of the frame-like housing member 2 is provided.

In addition, in the ceiling section of the fixing member 4, as shown in FIG. 7(c), an engaging and fixing section 4c is formed on the end side opposing the end side on which the aligning piece 4b is formed. As shown in FIG. 7(c), the engaging and fixing section 4c is a piece extending downward from the end side of the ceiling section described above and an engaging hole 4c-1 is formed in a vicinity of the center of the piece. Furthermore, an engaging protrusion 2e for engaging and fixing the fixing member 4 is formed on an outer peripheral section of the side wall section 2a-2 of the frame-like housing member 2.

From the state shown in FIG. 7(c), as the engaging and fixing section 4c side of the fixing member 4 is inclined toward the side wall section 2a-2 of the frame-like housing member 2 by using an engaging section of the aligning piece 4b and the engaging hole 2d as a fulcrum, a tip of the aligning piece 4b is gradually inserted into the engaging hole 2d. At this point, the engaging and fixing section 4c comes into contact with an outer surface of the side wall section 2a-2 and slides downward and, eventually, the engaging protrusion 2e fits into and engages with the engaging hole 4c-1. Accordingly, as shown in FIG. 7(d), the fixing member 4 is engaged with and fixed to the side wall section 2a-2.

Figure 9:
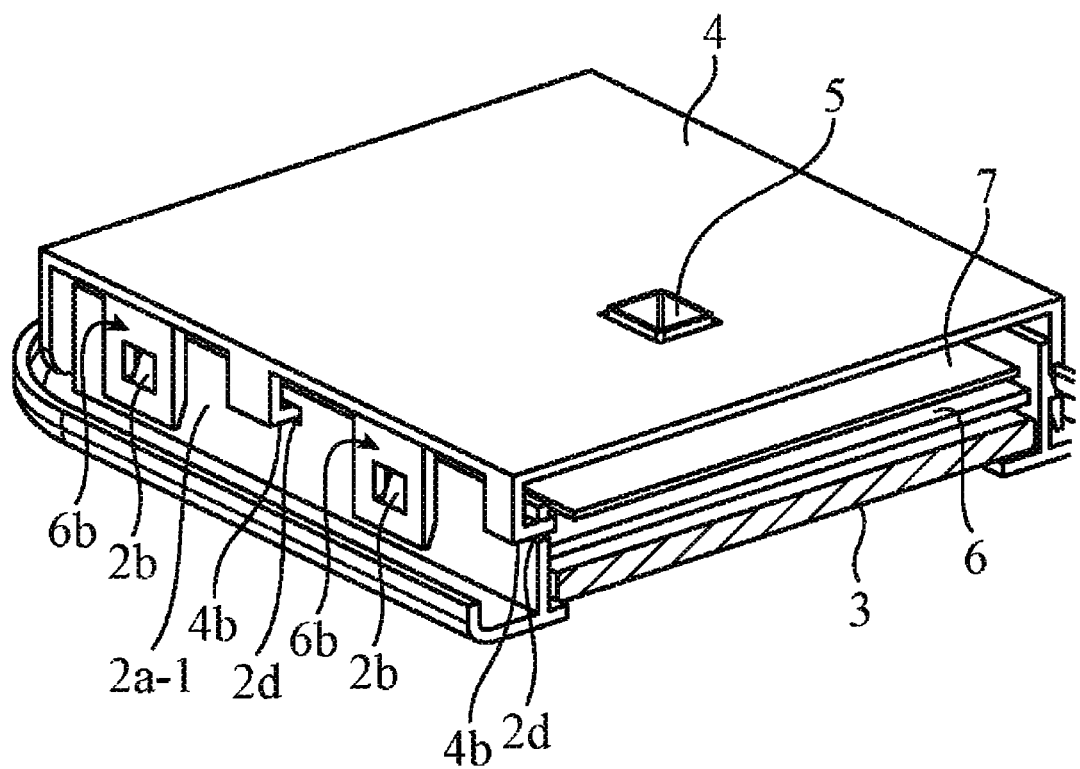
FIG. 9 is a sectional view taken along line A-A in FIG. 8(a).

FIG. 8 is a perspective view showing an electronic apparatus to which a fixing member is assembled, in which FIG. 8(a) is a perspective view as seen from the side wall section 2a-1 and FIG. 8(b) is a perspective view as seen from the side wall section 2a-2. In addition, FIG. 9 is a sectional perspective view taken along line A-A in FIG. 8(a). Furthermore, FIG. 10 is a diagram showing a structure of an engaging and aligning section and an engaging and fixing section of the fixing member according to Embodiment 1, in which FIG. 10(a) is a sectional perspective view of the engaging and aligning section and FIG. 10(b) is a sectional side view of the engaging and fixing section.

By being assembled to the frame-like housing member 2, the fixing member 4 is engaged and aligned with the side wall section 2a-1 of the frame-like housing member 2 as shown in FIG. 8(a) and engaged with and fixed to the side wall section 2a-2 that opposes the side wall section 2a-1 as shown in FIG. 8(b).

FIG. 10(a) is an enlarged sectional view of the engaging and fixing section shown in FIG. 9. In the present invention, engagement and fixing by the engaging and fixing section 4c and the engaging protrusion 2e shown in FIG. 10 merely represent an example and other configurations may be adopted as long as a structure enabling the fixing member 4 to be engaged with and fixed to the side wall section 2a-2 of the frame-like housing member 2 is provided. For example, a structure may be adopted in which the side wall section 2a-2 has an engaging hole and the engaging and fixing section 4c has an engaging protrusion.

Next, FIG. 10(b) is an enlarged sectional view of the engaging and aligning section shown in FIG. 9. As shown in FIG. 10(b), a portion D1 is in a state where the ceiling portion of the fixing member 4 is pushing the piece 6b-1 of the temporary holding member 6 in the direction indicated by an arrow and is in pressure contact with the piece 6b-1 of the temporary holding member 6. A portion D2 is in a state where the engaging hole 2d of the frame-like housing member 2 is pushing the aligning piece 4b of the fixing member 4 in the direction indicated by an arrow and is in pressure contact with the aligning piece 4b of the fixing member 4.

In other words, the fixing member 4 is in pressure contact with the temporary holding member 6 to directly press the temporary holding member 6 in an assembly direction and the fixing member 4 is in pressure contact with the frame-like housing member 2 to be pressed to the frame-like housing member 2 in an assembly direction. Accordingly, even if an external force is applied to an engaging and fixing section of the temporary holding member 6 and the frame-like housing member 2, since the engagement and fixing are assisted by the pressure contact provided by the fixing member 4, disengagement due to the external force can be prevented. In addition, since the members 4 and 6 are fixed while being in contact with each other, occurrence of noise due to the members colliding with each other can be prevented.

The present invention is provided with the temporary holding member 6 which is assembled to the frame-like housing member 2 that houses the display module 3 and the fixing member 4 which performs engagement and alignment as well as engagement and fixing at an alternating position with respect to the temporary holding member 6. In this case, since the fixing member 4 and the temporary holding member 6 both enable engagement and alignment as well as engagement and fixing by a simple operation of fitting engaging protrusions into engaging holes, the electronic apparatus 1 can be easily assembled and disassembled. In addition, since the display module 3 is doubly held by the temporary holding member 6 and the fixing member 4, the display module 3 can be firmly held.

When disassembling the electronic apparatus 1, first, the engagement and fixing of the fixing member 4 at the side wall section 2a-2 of the frame-like housing member 2 is disengaged. Namely, the fixing member 4 is detached from the frame-like housing member 2 by disengaging the engaging hole 4c-1 of the engaging and fixing section 4c from the engaging protrusion 2e of the side wall section 2a-2, lifting up the engaging and fixing section 4c side of the fixing member 4 by using the engaging section of the aligning piece 4b and the engaging hole 2d as a fulcrum, and subsequently pulling out the aligning piece 4b from the engaging hole 2d.

Moreover, while shear-fracturing the aligning piece 4b is conceivable as another method of detaching the fixing member 4, shear-fracturing is more difficult than the operation of detaching the engaging and fixing section 6b from the engaging protrusion 2e.

Next, the engagement and fixing of the temporary holding member 6 at the side wall section 2a-1 of the frame-like housing member 2 is disengaged.

Namely, the temporary holding member 6 is detached from the frame-like housing member 2 by disengaging the engaging hole 6b-2 of the piece 6b-1 from the engaging protrusion 2b of the side wall section 2a-1, lifting up the engaging and fixing section side of the temporary holding member 6 by using the engaging section of the aligning protrusion 6c and the engaging hole 2c as a fulcrum, and subsequently pulling out the aligning protrusion 6c from the engaging hole 2c.

In this manner, in order to respectively detach the fixing member 4 and the temporary holding member 6 from the frame-like housing member 2, the operations described above must be alternately performed at the side wall sections 2a-1 and 2a-2. As a result, the fixing member 4 and the temporary holding member 6 are structured so that disengagement is less likely to occur due to naturally-applied external forces (such as vibration).

In addition, in an actual use environment, the electronic apparatus 1 only exposes the display surface and a configuration on the rear surface is housed in an attachment location. In this case, normally, locations that can be touched by a user are the front surface of the frame-like housing member 2 and the display surface of the display module 3.

In particular, when a touch panel is mounted onto the display surface of the display module 3, a user may firmly press down on the display surface of the display module 3.

The force of a user pressing down on the display surface is transmitted via the urging member 6d to portions D1 and D2 (engaging and aligning sections) shown in FIG. 10(b).

On the other hand, since the engaging and fixing section side of the fixing member 4 is not in contact with the temporary holding member 6, the external force is not directly transmitted. Therefore, unless the structure of the engaging and aligning section of the fixing member 4 is destroyed, it is difficult to disengage the engaging and fixing section of the fixing member 4.

In addition, even if the weight of the display module 3 is significant, since the weight acts on the engaging and aligning section of the fixing member 4 via the urging member 6d and does not act on the engaging and fixing section, assembly that is less affected by the weight of the display module 3 can be realized.

For example, when vibration acts on the electronic apparatus 1, even if the display module 3 that has heavy weight resonates and the vibration is transmitted via the urging member 6d to the location where the temporary holding member 6 is engaged with and fixed to the frame-like housing member 2, the fixing member 4 is in pressure contact with the temporary holding member 6 and the frame-like housing member 2 at the portions D1 and D2 shown in FIG. 10(b) and can prevent the temporary holding member 6 from disengaging from the frame-like housing member 2.n addition, since the fixing member 4 is lighter than the display module 3, the engagement between the engaging and fixing section 4c and the engaging protrusion 2e is unlikely to become disengaged due to vibration.

As described above, the present invention realizes highly-reliable housing even if an electrical unit that is a housing object has heavy weight.

Furthermore, when disassembling the electronic apparatus 1 on a production line, a worker can release the engagement and fixing of the fixing member 4 and the engagement and fixing of the temporary holding member 6 with a simple operation of disengaging engaging protrusions from engaging holes without requiring special tools.

Moreover, while a structure with a built-in electronic substrate 7 has been illustrated in the description given above, similar advantageous effects can be obtained with the electronic apparatus 1A in which electronic substrate 7 is omitted.

In addition, since the present invention adopts engagement and fixing by engaging protrusions and engaging holes to eliminate screwing locations, reductions in operation expenses and component costs can be achieved.

While FIG. 10(b) shows a case where the fixing member 4 is in pressure contact with the temporary holding member 6 at the portion D1 and the frame-like housing member 2 and the fixing member 4 are in pressure contact with each other at the portion D2, a configuration in which a gap is provided between members may also be adopted. In this case, any structure may be adopted which enables the urging member 6d of the temporary holding member 6 to urge the display module 3 even if the temporary holding member 6 moves by a distance corresponding to the gap.

As described above, according to Embodiment 1, a display module 3; a frame-like housing member 2 which has at least one open surface and which houses the display module 3 in a space enclosed by side walls of the opening; a temporary holding member 6 which is assembled to the frame-like housing member 2 so as to cover the display module 3; and a fixing member 4 which is assembled to the frame-like housing member 2 so as to cover the temporary holding member 6 are provided, wherein the frame-like housing member 2 has side wall sections 2a-1 and 2a-2 opposing each other, the temporary holding member 6 is assembled to the frame-like housing member 2 by being engaged and aligned with the side wall section 2a-2 and by being engaged with and fixed to the side wall section 2a-1, and the fixing member 4 is assembled to the frame-like housing member 2 by being engaged and aligned with the side wall section 2a-1 and by being engaged with and fixed to the side wall section 2a-2.

As described above, since the fixing member 4 and the temporary holding member 6 both enable engagement and alignment as well as engagement and fixing by a simple operation such as fitting an engaging protrusion into an engaging hole, the electronic apparatus 1 can be easily assembled and disassembled.

In addition, since the display module 3 is doubly held by the temporary holding member 6 and the fixing member 4, the display module 3 can be firmly held.

In particular, since disengagement operations must be alternately performed at the side wall sections 2a-1 and 2a-2 in order to respectively detach the fixing member 4 and the temporary holding member 6 from the frame-like housing member 2, the fixing member 4 and the temporary holding member 6 are structured so that disengagement is less likely to occur due to naturally-applied external forces (such as vibration).

In addition, according to Embodiment 1, the temporary holding member 6 includes an urging member 6d for urging the display module 3. By adopting such a configuration, the display module 3 can be housed inside the frame-like housing member 2 without play.

Moreover, according to Embodiment 1, the fixing member 4 comes into pressure contact with a part of: the temporary holding member 6 on a side where the temporary holding member 6 is engaged with and fixed to the frame-like housing member 2; and the frame-like housing member 2. By adopting such a configuration, even if an external force is applied to the engaging and fixing section of the temporary holding member 6 and the frame-like housing member 2, since the engagement and fixing are assisted by the pressure contact provided by the fixing member 4, disengagement due to the external force can be prevented. In addition, due to pressure contact provided by the fixing member 4, occurrence of noise due to the members colliding with each other in a gap between the members can be prevented.

Embodiment 2

Figure 11:
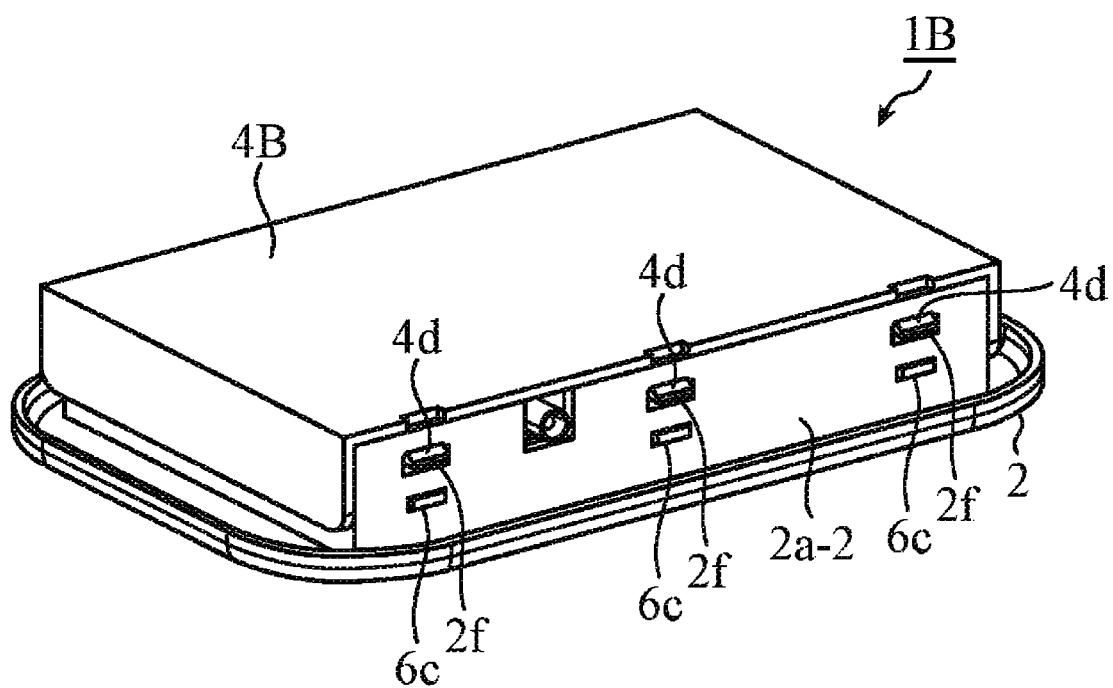
FIG. 11 is a perspective view showing an electronic apparatus according to Embodiment 2 of the present invention.

FIG. 11 is a perspective view showing an electronic apparatus according to Embodiment 2 of the present invention. As shown in FIG. 11, an electronic apparatus 1B according to Embodiment 2 is configured so as to include a fixing member 4B having an engaging and fixing section which differs from that of Embodiment 1. As shown in FIG. 11, in the fixing member 4B, an engaging and fixing section 4d is formed on an end side of a ceiling section. In addition, an engaging hole 2f for engagement and fixing is formed on a side wall section 2a-2 of a frame-like housing member 2.

FIG. 12 is a diagram showing an assembling mode of a fixing member according to Embodiment 2. As shown in FIG. 12(a), an aligning piece 4b is formed on one end side of the fixing member 4B. In a similar manner to Embodiment 1, the aligning piece 4b is structured such that a tip of the piece extending downward from the end side of the ceiling section described above is folded inward in a hook shape. In addition, an engaging hole 2d for alignment is formed on a side wall section 2a-1 of the frame-like housing member 2.

In addition, in the fixing member 4B, as shown in FIG. 12(b), an engaging and fixing section 4d is formed on the end side opposing the end side on which the aligning piece 4b is formed. As shown in FIG. 12(b), the engaging and fixing section 4d extends downward from the end side of the ceiling section described above and an engaging protrusion 4d-1 is formed at a tip folded outward.

Furthermore, an engaging hole 2f for engaging and fixing the fixing member 4B is formed on the side wall section 2a-2 of the frame-like housing member 2.

Figure 13:
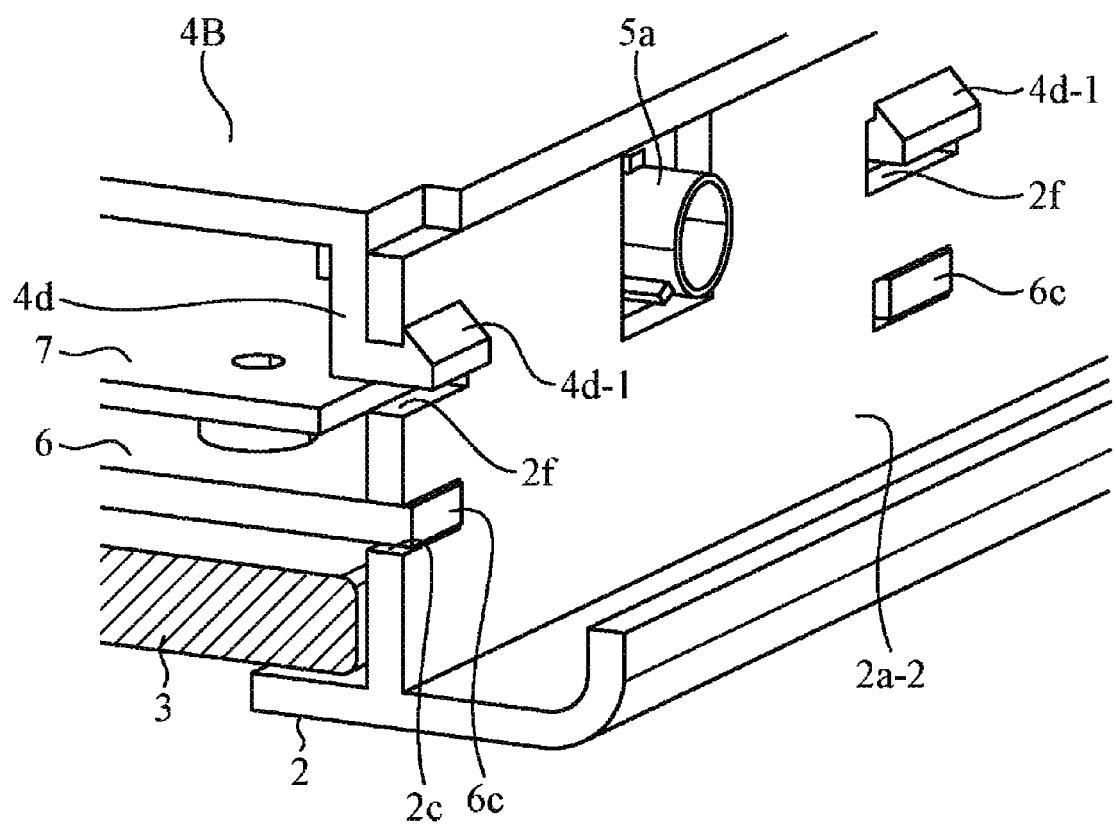
FIG. 13 is a sectional view showing an engaging and fixing section of the fixing member according to Embodiment 2.

When assembling the fixing member 4B to the frame-like housing member 2, after arranging the fixing member 4B so that the engaging and fixing section 4d is positioned inside the frame-like housing member 2, the fixing member 4B is slid in a direction of the side wall section 2a-2 from the side wall section 2a-1. Subsequently, by inserting the aligning piece 4b into the engaging hole 2d from outside the frame-like housing member 2, the fixing member 4B is engaged and aligned with the side wall section 2a-1. Meanwhile, as shown in FIG. 13, the engaging protrusion 4d-1 of the engaging and fixing section 4d fits into the engaging hole 2f of the side wall section 2a-2 and is hooked on an opening edge section. Accordingly, the fixing member 4B is engaged with and fixed to the side wall section 2a-2.

In Embodiment 1, after the fixing member 4 is engaged and aligned with the side wall section 2a-1, the engaging and fixing section 4c side of the fixing member 4 is inclined toward the side wall section 2a-2 by using the engaging and aligning section of the fixing member 4 and the side wall section 2a-1 as a fulcrum so that the engaging protrusion 2e fits into and engages with the engaging hole 4c-1 of the engaging and fixing section 4c. Therefore, there is a possibility that the engaging and aligning section may become disengaged prior to engagement and fixing.

In contrast, with Embodiment 2, since the fixing member 4B is only required to be assembled from one direction of the frame-like housing member 2, workability of assembly can be significantly improved as compared to Embodiment 1.

Moreover, as shown in FIGS. 12 and 13, the fixing member 4B is effective in a case of a structure in which a connector 5a mounted on the electronic substrate 7 is exposed to the outside from the side wall 2a (for example, the side wall section 2a-2).

As described above, according to Embodiment 2, by assembling the fixing member 4B from one direction (the direction toward the side wall section 2a-2) of the frame-like housing member 2, the fixing member 4B is engaged and aligned with the side wall section 2a-1 and engaged with and fixed to the side wall section 2a-2. By adopting such a configuration, since the fixing member 4B is only required to be assembled from one direction of the frame-like housing member 2, assembly can be performed more easily than Embodiment 1. Accordingly, workability of assembly can be improved.

Moreover, while cases where the respective members are formed of resin material have been particularly shown in Embodiments 1 and 2, materials other than resin material can be used as long as functions of the respective members are fulfilled.

Embodiment 3

FIG. 14 is a diagram showing an electronic apparatus according to Embodiment 3 of the present invention, in which FIG. 14(a) is a front-side perspective view and FIG. 14(b) is a rear-side perspective view. In an electronic apparatus 1C according to Embodiment 3, respective members 2, 40, and 6 are formed of sheet metal.

In addition, as shown in FIG. 14(a), in the electronic apparatus 1C, a display surface of a display module 3 is exposed to the outside through an opening on a front surface of a frame-like housing member 2. As shown in FIG. 14(b), fixing member 40 is a member that covers a rear surface and a part of a side wall 2a of the frame-like housing member 2. Furthermore, an internal circuit of the electronic apparatus 1C is connected to an external circuit via connectors 5b and 5c that are exposed from the rear surface of the fixing member 40.

Figure 15:
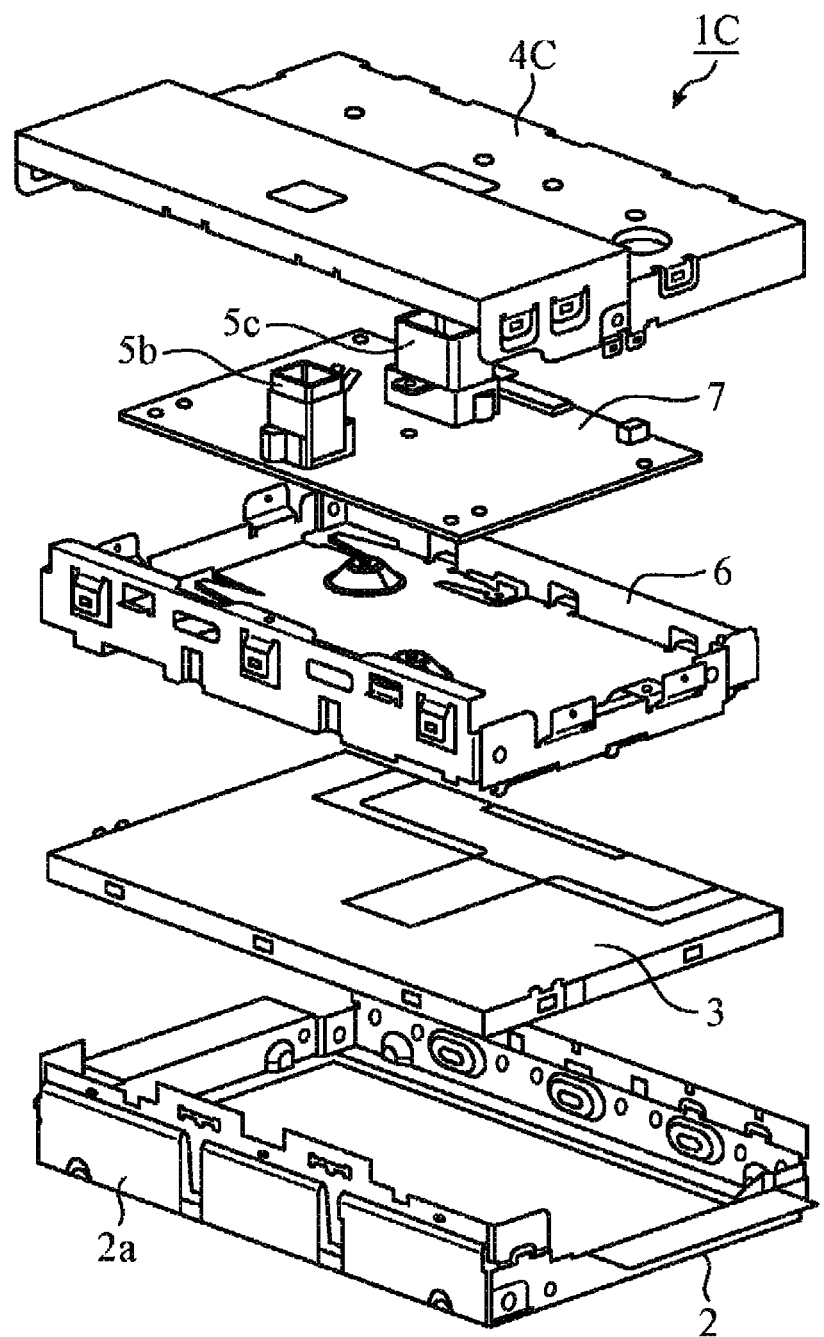
FIG. 15 is an exploded perspective view of the electronic apparatus according to Embodiment 3.

FIG. 15 is an exploded perspective view of the electronic apparatus according to Embodiment 3. In FIG. 15, a temporary holding member 6 is a first member which is assembled to the frame-like housing member 2 so as to cover the display module 3 in a similar manner to Embodiment 1. In addition, an electronic substrate 7 is a printed board on which the connectors 5b and 5c are mounted. In addition, the fixing member 4C is a second member which is assembled to the frame-like housing member 2 so as to cover the temporary holding member 6.

Figure 16:
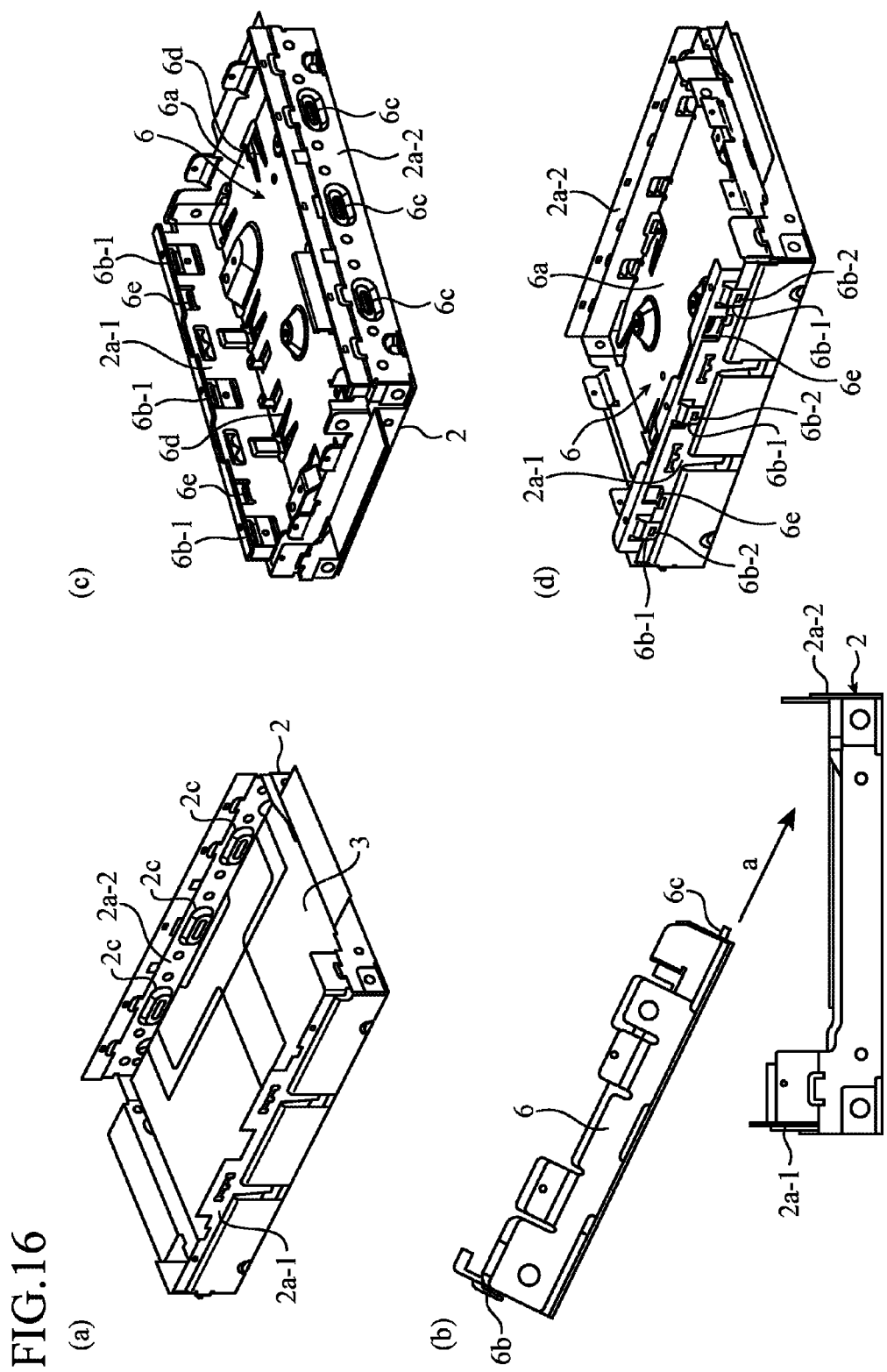
FIGS. 16(a) to 16(d) are diagrams showing an assembling procedure of a temporary holding member according to Embodiment 3.

FIG. 16 is a diagram showing an assembling procedure of the temporary holding member according to Embodiment 3, in which assembly is performed in the order from FIG. 16(a) to FIG. 16(c). In addition, FIG. 16(d) is a perspective view in which a structure after assembling the temporary holding member 6 is seen from a side wall section 2a-1. As shown in FIG. 16(a), the display module 3 is housed in the frame-like housing member 2. In a similar manner to Embodiment 1, in the temporary holding member 6, an engaging and fixing section 6b is formed on one end side of a plate-like section 6a that constitutes a main body section, and an aligning protrusion 6c is formed on the end side that opposes the one end side. Furthermore, an engaging hole 2c for alignment is formed on a side wall section 2a-2 of the frame-like housing member 2.

When assembling the temporary holding member 6 to the frame-like housing member 2, as shown in FIG. 16(b), the temporary holding member 6 is inserted (in the direction a) with the aligning protrusion 6c oriented toward the side wall section 2a-2 of the frame-like housing member 2.

Next, in a similar manner to Embodiment 1, in a state where the temporary holding member 6 is inclined with respect to the frame-like housing member 2, the aligning protrusion 6c is engaged with the engaging hole 2c from the inside of the frame-like housing member 2.

In other words, a tip of the aligning protrusion 6c is inserted from the inside of the frame-like housing member 2 and abutted against an inner wall of the engaging hole 2c. Accordingly, as shown in FIG. 17(a), the temporary holding member 6 is engaged and aligned with the frame-like housing member 2.

In addition, as shown in FIG. 18(a), the engaging and fixing section 6b of the temporary holding member 6 is constituted by a piece 6b-1 and an engaging hole 6b-2 formed at an end of the piece 6b-1.

The piece 6b-1 is a piece whose tip has been cut and raised so that spacing between the tip and the base thereof is approximately same to the thickness of the side wall section 2a-1.

Furthermore, an urging member 6d is formed on the plate-like section 6a of the temporary holding member 6 by folding a part of the plate-like section 6a downward. An engaging protrusion 2b that is a dowel for engaging and fixing the temporary holding member 6 is formed on an outer peripheral section of the side wall section 2a-1 of the frame-like housing member 2.

Subsequently, as the engaging and fixing section 6b side of the temporary holding member 6 is inclined toward the side wall section 2a-1 of the frame-like housing member 2 by using an engaging section of the aligning protrusion 6c and the engaging hole 2c as a fulcrum, the aligning protrusion 6c is gradually inserted into the engaging hole 2c as shown in FIG. 17(b).

At this point, the side wall section 2a-1 is gradually inserted into a curved section of the piece 6b-1 and, eventually, the engaging protrusion 2b fits into and engages with the engaging hole 6b-2. Accordingly, as shown in FIGS. 18(b) and 18(c), the temporary holding member 6 is engaged with and fixed to the side wall section 2a-1.

Moreover, as shown in FIG. 18(d), a protrusion 6f-1 that is abutted by the fixing member 4C is formed on a side wall section 6f in which the engaging and fixing section 6b of the temporary holding member 6 is provided.

In addition, a sinking-preventing piece 6e that is cut and bent outward from the side wall section 6f is formed on the temporary holding member 6. As shown in FIG. 18(d), the sinking-preventing piece 6e abuts against the side wall section 2a-1 when the temporary holding member 6 is assembled. Accordingly, even when subjected to pressure contact by the fixing member 4C, the temporary holding member 6 can be regulated not to sink below a prescribed position.

As shown in FIG. 19(a), the urging member 6d of the temporary holding member 6 is a claw-like member formed by folding a part of the plate-like section 6a downward, and a tip of the urging member 6d is curved as shown in FIG. 19(b). In a state where the temporary holding member 6 is assembled to the frame-like housing member 2, the urging member 6d abuts against a rear surface of the display module 3 at a portion corresponding to a turning point of the curve and urges the display module 3 toward a front surface thereof. Accordingly, a peripheral edge section of the display module 3 is pressed against the installation margin 2a-3 and the display module 3 can be housed inside the frame-like housing member 2 without play.

Figure 20:
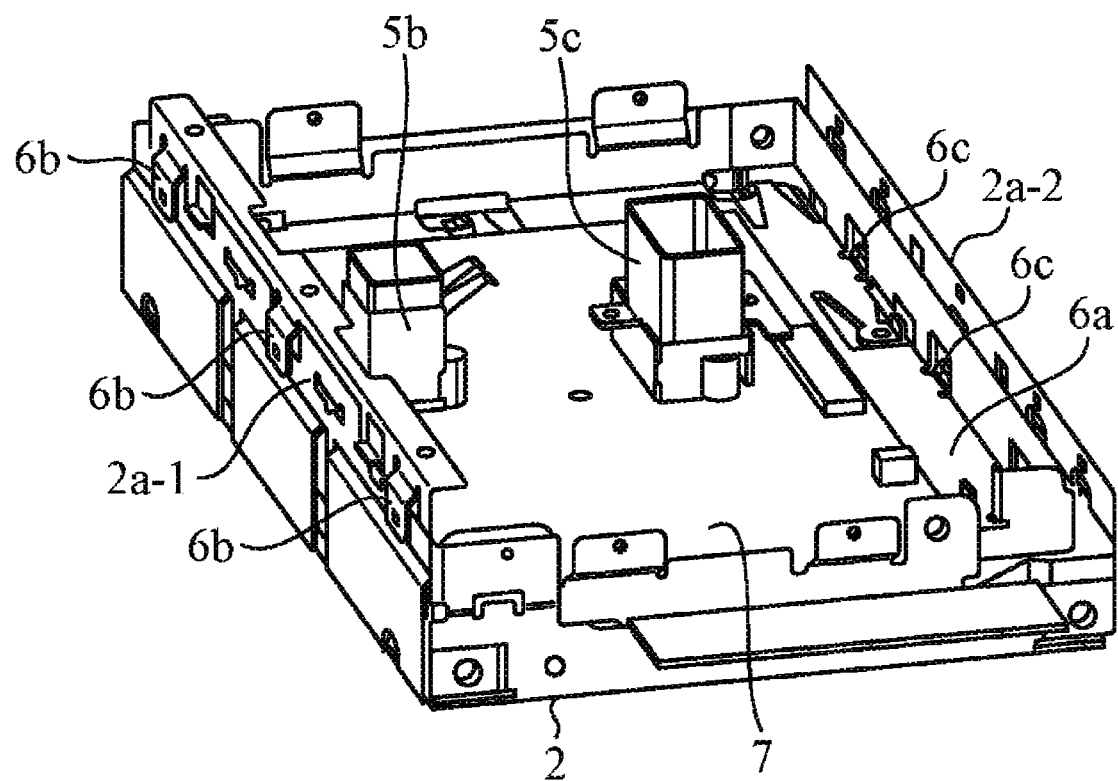
FIG. 20 is a perspective view showing a state in which a substrate is mounted to the temporary holding member according to Embodiment 3.

FIG. 20 is a perspective view showing a state in which a substrate is mounted to the temporary holding member according to Embodiment 3. As shown in FIG. 20, the electronic substrate 7 is mounted on an upper surface of the temporary holding member 6 assembled to the frame-like housing member 2. For example, the electronic substrate 7 is screwed to the plate-like section 6a of the temporary holding member 6.

Moreover, fixing of the electronic substrate 7 is not limited to screwing and various other fastening methods may be applied.

Figure 21:
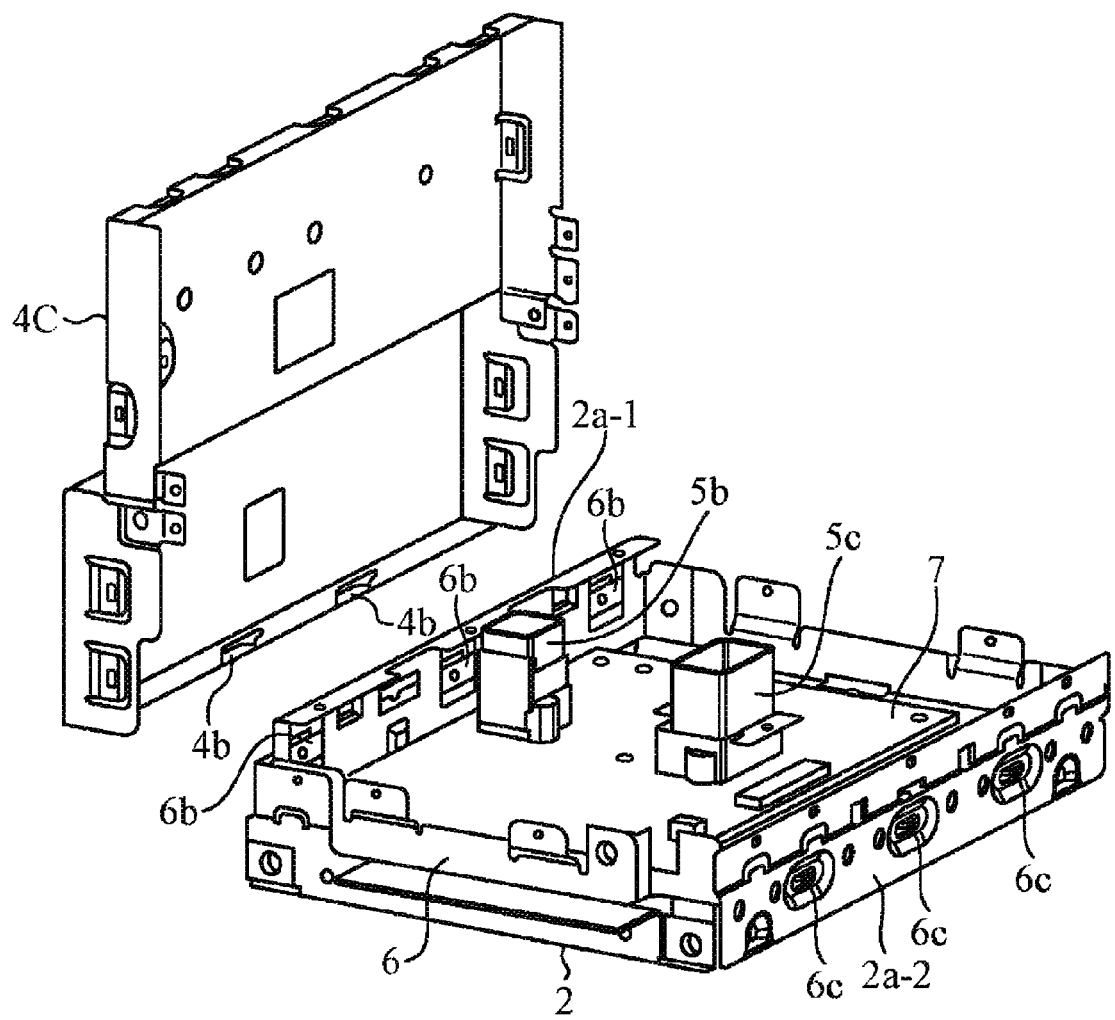
FIG. 21 is a diagram showing a fixing member according to Embodiment 3.
Figure 22:
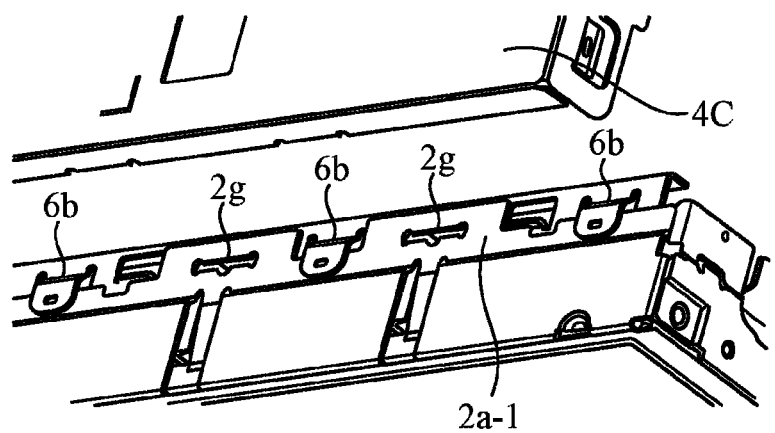
FIG. 22 is a diagram showing an engaging section of the frame-like housing member according to Embodiment 3.
Figure 23:
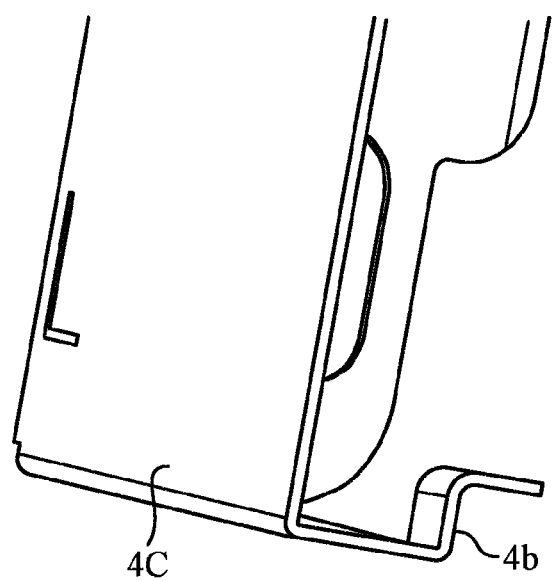
FIG. 23 is an enlarged sectional view showing an engaging and aligning section of the fixing member according to Embodiment 3.

FIG. 21 is a diagram showing the fixing member according to Embodiment 3, and is a perspective view of a structure in which the temporary holding member 6 is assembled to the frame-like housing member 2, and the fixing member 4C. In addition, FIG. 22 is a diagram showing an engaging and aligning section of the frame-like housing member according to Embodiment 3 and shows the side wall section 2a-1 on which an engaging and fixing section for engagement and fixing of the fixing member 4C is formed. Furthermore, FIG. 23 is an enlarged sectional view showing an engaging and aligning section of the fixing member according to Embodiment 3.

As shown in FIG. 21, in the fixing member 4C, an aligning piece 4b is formed on one end side of a ceiling section. As shown in FIG. 23, the aligning piece 4b is structured such that a piece provided on the aforementioned end side of the ceiling section described above is folded inward and, further, a tip thereof is folded downward. In addition, as shown in FIG. 22, an engaging hole 2g for alignment is formed on the side wall section 2a-1 of the frame-like housing member 2.

Figure 24:
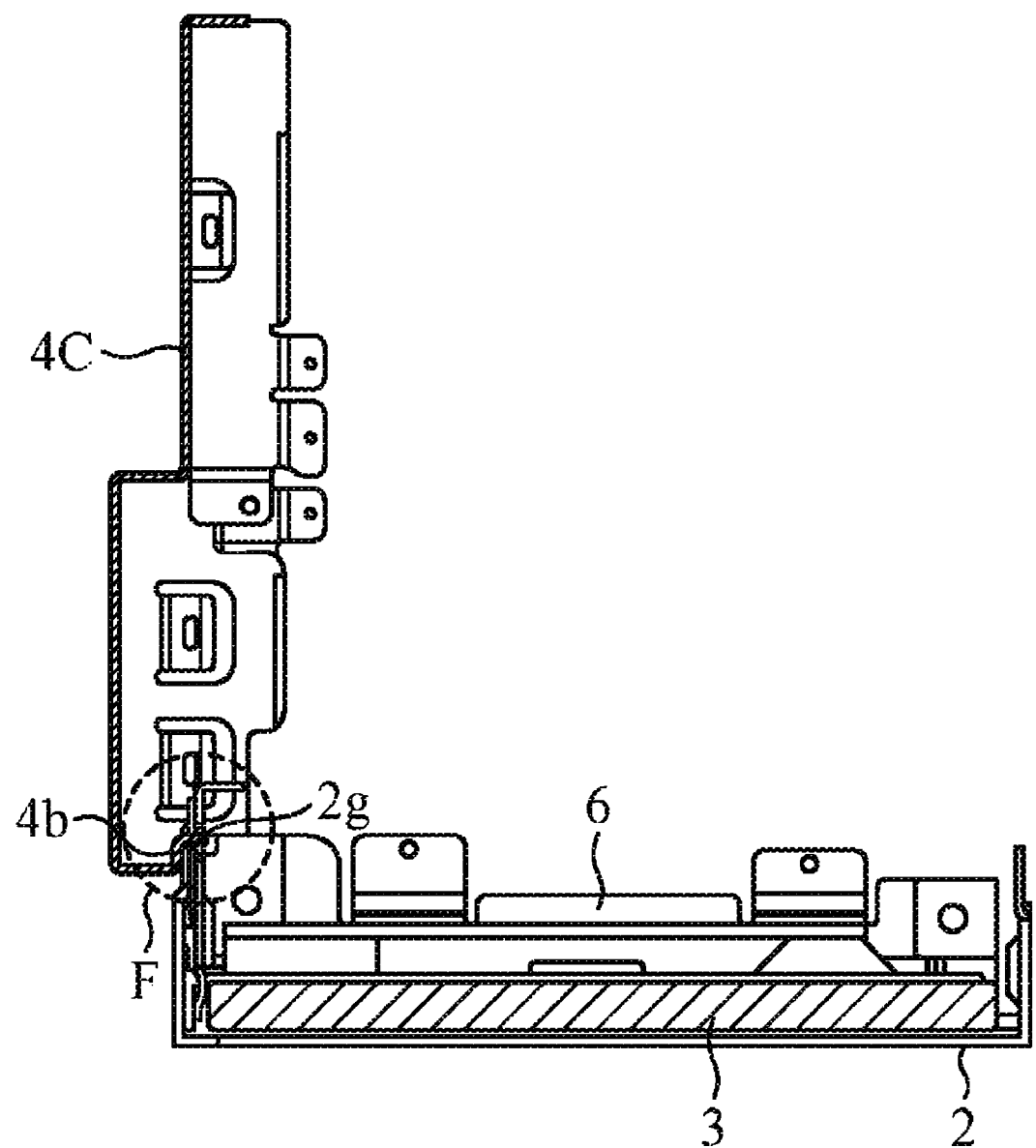
FIG. 24 is a sectional side view of a state where the fixing member is engaged and aligned with the frame-like housing member according to Embodiment 3.

FIG. 24 is a sectional side view of a state where the fixing member is engaged and aligned with the frame-like housing member according to Embodiment 3. In addition, FIG. 25 is an enlarged sectional view of a region F shown in FIG. 24.

When assembling the fixing member 4C on the frame-like housing member 2, first, the aligning piece 4b of the fixing member 4C is inserted into the engaging hole 2g of the side wall section 2a-1 to engage and align the fixing member 4C with the side wall section 2a-1. At this point, as shown in FIG. 25(a), a folded corner portion 4b-1 of the aligning piece 4b is abutted against an inner wall section 2g-1 of the engaging hole 2g.

Figure 26:
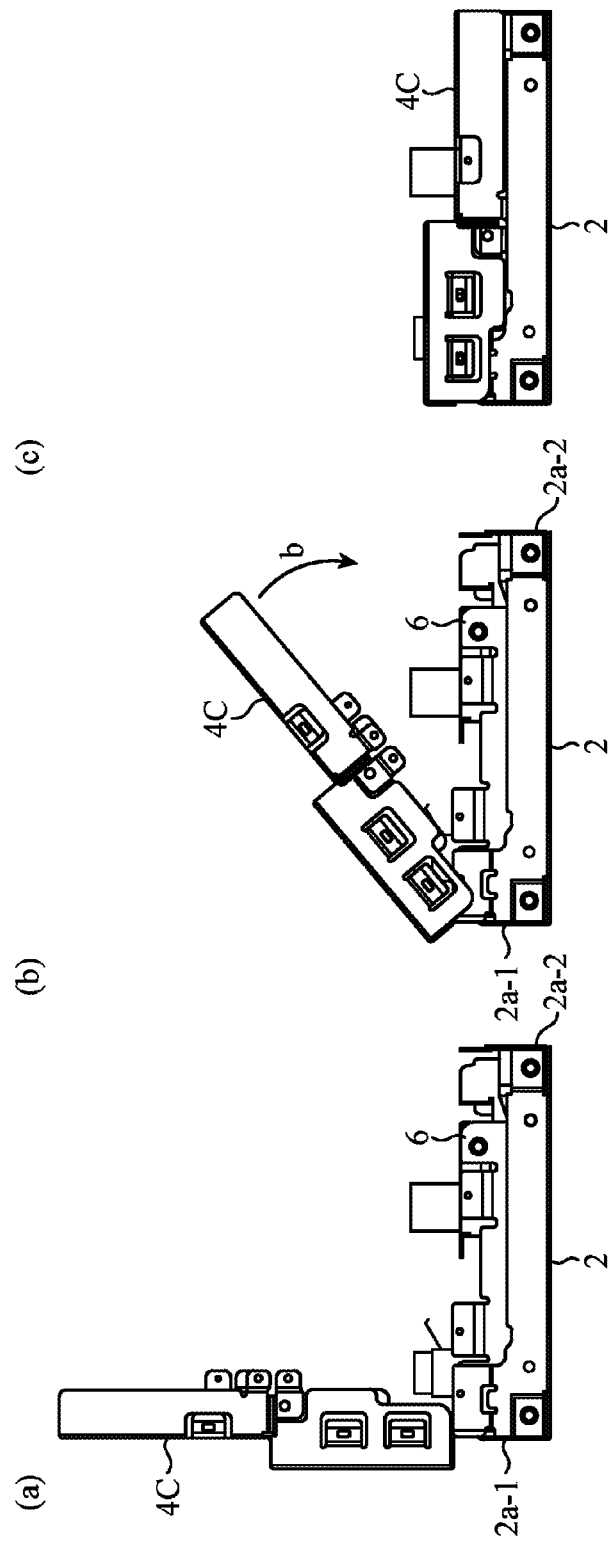
FIGS. 26(a) to 26(c) are diagrams showing an assembling procedure of the fixing member according to Embodiment 3.

FIG. 26 is a diagram showing an assembling procedure of the fixing member according to Embodiment 3, in which assembly is performed in the order from FIG. 26(a) to FIG. 26(c). In FIG. 26, it is assumed that the temporary holding member 6 is assembled to the frame-like housing member 2 (the structure shown in FIG. 20). First, as shown in FIG. 26(a), the fixing member 4C is aligned with the side wall section 2a-1.

In this state, as shown in FIG. 26(b), the fixing member 4C is turned in the direction b by using an abutting section between the aligning piece 4b and the engaging hole 2g as a fulcrum. Subsequently, by causing the engaging and fixing section to be engaged with and fixed to the side wall section 2a-2, as shown in FIG. 26(c), the fixing member 4C is assembled to the frame-like housing member 2.

Moreover, the folded corner portion 4b-1 of the aligning piece 4b is abutted against the inner wall section 2g-1 that corresponds to the thickness of the engaging hole 2g, and the fixing member 4C can smoothly turn using the aligning section as a fulcrum. Accordingly, workability of assembly can be significantly improved as compared to Embodiment 1.

Figure 27:
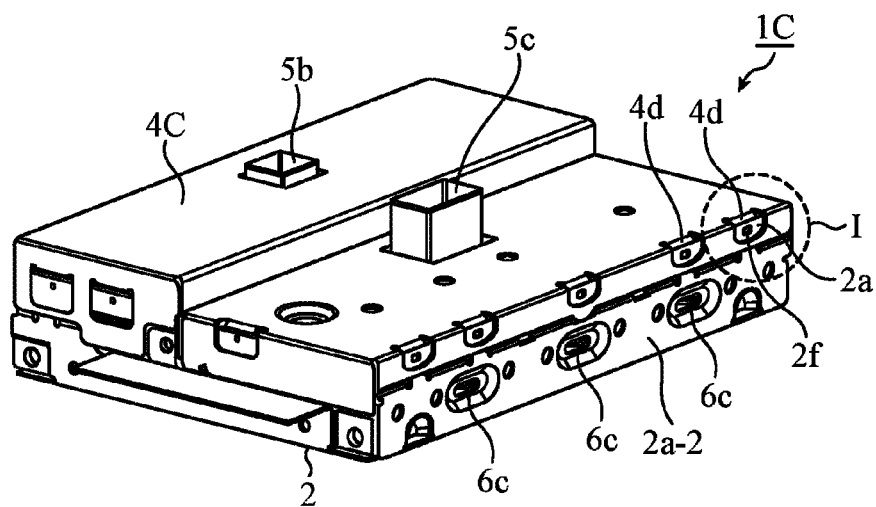
FIG. 27 is a perspective view showing the electronic apparatus according to Embodiment 3.
Figure 28:
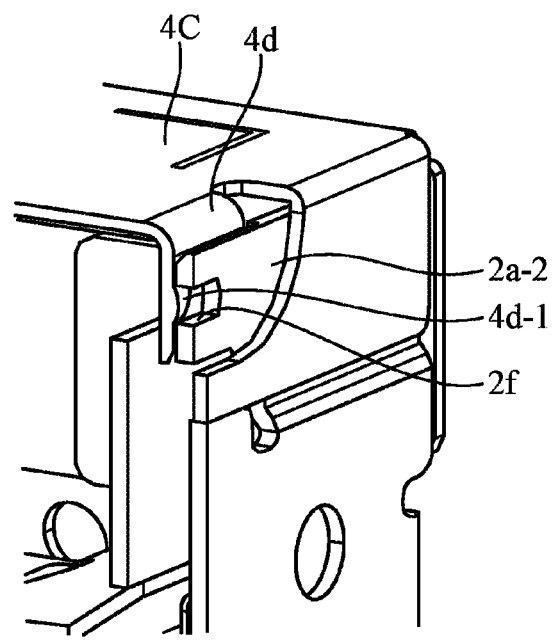
FIG. 28 is an enlarged sectional view of a region I shown in FIG. 27.

FIG. 27 is a perspective view showing the electronic apparatus according to Embodiment 3. In addition, FIG. 28 is an enlarged sectional view of the region I shown in FIG. 27. As shown in FIGS. 27 and 28, the engaging and fixing section 4d is a piece created by cutting and bending an end of the ceiling section of the fixing member 4C downward, and an engaging protrusion 4d-1 that is a dowel is formed in a vicinity of the center of the engaging and fixing section 4d. In addition, an engaging hole 2f for engaging and fixing the fixing member 4C is formed on an outer peripheral section of the side wall section 2a-2 of the frame-like housing member 2. By turning the fixing member 4C toward the frame-like housing member 2 using, as a fulcrum, a portion of the fixing member 4c that is engaged and aligned with the side wall section 2a-1, the engaging protrusion 4d-1 of the engaging and fixing section 4d fits into the engaging hole 2f of the side wall section 2a-2. Accordingly, the fixing member 4C is engaged with and fixed to the side wall section 2a-2.

Figure 29:
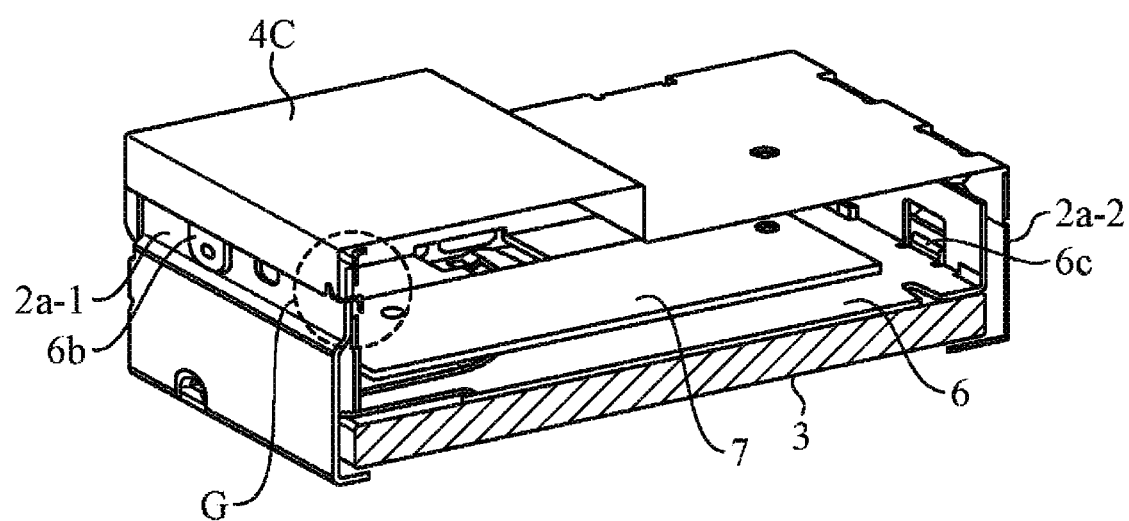
FIG. 29 is a sectional side view of the electronic apparatus according to Embodiment 3.

FIG. 29 is a sectional side view of the electronic apparatus according to Embodiment 3. In addition, FIG. 30 is an enlarged sectional view of the region G shown in FIG. 29. By being assembled to the frame-like housing member 2, as shown in FIG. 30(a), the fixing member 4C is engaged and aligned with the side wall section 2a-1 of the frame-like housing member 2 and engaged with and fixed to the side wall section 2a-2 that opposes the side wall section 2a-1.

As shown in FIG. 30(b), a portion H1 is in a state where the ceiling portion of the fixing member 4C is pushing the temporary holding member 6 via the protrusion 6f-1 in the direction indicated by an arrow and is in pressure contact with the temporary holding member 6. In addition, a portion H2 is in a state where the engaging hole 2g of the frame-like housing member 2 is pushing the aligning piece 4b of the fixing member 4C in the direction indicated by an arrow and is in pressure contact with the aligning piece 4b of the fixing member 4C. In other words, the fixing member 4C is in pressure contact with the temporary holding member 6 to directly press the temporary holding member 6 in the assembly direction and the fixing member 4C is in pressure contact with the frame-like housing member 2 to directly press the frame-like housing member 2 in the assembly direction.

Moreover, even if the fixing member 4C is in pressure contact with the temporary holding member 6, since the sinking-preventing piece 6e shown in FIG. 18(d) abuts against the side wall section 2a-1, the temporary holding member 6 does not sink in the direction indicated by an arrow beyond a prescribed position.

Since assembly is performed as described above, even if an external force is applied to the engaging and fixing section of the temporary holding member 6 and the frame-like housing member 2, since the engagement and fixing are assisted by the pressure contact provided by the fixing member 4C, disengagement due to the external force can be prevented. In addition, since the members 4C and 6 are fixed while being in contact with each other, occurrence of noise due to the members colliding with each other can be prevented.

As described above, according to Embodiment 3, the fixing member 4C is assembled to the frame-like housing member 2 by being turned using, as a fulcrum, a portion of the fixing member 4C that is engaged and aligned with the side wall section 2a-1, while the side to be engaged and fixed is oriented toward the frame-like housing member 2. By adopting such a configuration, since the fixing member 4C needs only be turned and assembled to the frame-like housing member 2, assembly can be performed more easily than Embodiment 1. Accordingly, workability of assembly can be improved.

As described above, it is to be understood that the respective embodiments of the present invention can be combined in any way, and any of the components of the respective embodiments may be modified or omitted without departing from the spirit and scope of the invention.

INDUSTRIAL APPLICABILITY

Since the electronic apparatus according to the present invention enables assembly and disassembly to be readily performed and enables a housing object to be firmly held, the electronic apparatus according to the present invention is suitable as, for example, a vehicle-mounted electronic apparatus requiring resistance to vibration that occurs during travel of the vehicle.

EXPLANATION OF REFERENCE NUMERALS 1, 1A to 1C: electronic apparatus
2: frame-like housing member
2a: side wall
2a-1, 2a-2, 6f: side wall section
2a-3: installation margin
2b, 2e, 4d-1, 6c: engaging protrusion 2c, 2d, 2f, 2g, 4c-1, 6b-2: engaging hole
2g-1: inner wall section
3: display module
4, 4A to 4C: fixing member
4a: opening
4b: aligning piece
4b-1: corner portion
5, 5a to 5c: connector
6: temporary holding member
6a: plate-like section
4c, 4d, 6b: engaging and fixing section
6b-1: piece
6d: urging member
6e: sinking-preventing piece
6f-1: protrusion
7: electronic substrate

The invention claimed is:

1. An electronic apparatus comprising:
a housing object;
a housing section which has at least one surface being an opening and which houses the housing object in a space enclosed by side walls of the opening;
a first member which is assembled to the housing section so as to cover the housing object; and
a second member which is assembled to the housing section so as to cover the first member, wherein
the housing section has first and second side wall sections opposing each other, a portion of the first member being engaged and aligned with the second side wall section, and the first member being assembled to the housing section by turning, with using the portion of the first member that is engaged and aligned with the second side wall section as a fulcrum, a side of the first member to be engaged with and fixed to the first side wall section toward the housing section,
the second member being assembled to the housing section by being engaged and aligned with the first side wall section, and by being engaged with and fixed to the second side wall section so as to prevent disengagement of the engagement and fixing of the first member;
wherein the first member is engaged and aligned with the second side wall section without snap-fitting, and is engaged and fixed to the first side wall section with snap-fitting, and
the second member is engaged and aligned with the first side wall section without snap-fitting, and is engaged and fixed to the second side wall section with snap-fitting.

2. The electronic apparatus according to claim 1, wherein the first member includes an urging member that urges the housing object.

3. The electronic apparatus according to claim 1, wherein the second member is in pressure contact with a part of: the first member on a side where the first member is engaged with and fixed to the housing section; and the first member.

4. The electronic apparatus according to claim 1, wherein the second member is assembled to the housing section by being turned using, as a fulcrum, a portion of the second member that is engaged and aligned with the first side wall section, while the side to be engaged and fixed is oriented toward the housing section.

5. An electronic apparatus comprising:
a housing object;
a housing section which has at least one surface being an opening and which houses the housing object in a space enclosed by side walls of the opening;
a first member which is assembled to the housing section so as to cover the housing object; and
a second member which is assembled to the housing section so as to cover the first member, wherein
the housing section has first and second side wall sections opposing each other, a portion of the first member being engaged and aligned with the second side wall section, and the first member being assembled to the housing section by turning, with using the portion of the first member that is engaged and aligned with the second side wall section as a fulcrum, a side of the first member to be engaged with and fixed to the first side wall section toward the housing section,
the second member being assembled to the housing section by being engaged and aligned with the first side wall section, and by being engaged with and fixed to the second side wall section so as to prevent disengagement of the engagement and fixing of the first member;
wherein the second member is engaged and aligned with the first side wall section and engaged with and fixed to the second side wall section by sliding the second member in a direction from the first side wall section to the second side wall section.

* * * * *